(12) United States Patent
Nemoto

(10) Patent No.: US 7,799,662 B2
(45) Date of Patent: Sep. 21, 2010

(54) POWER SEMICONDUCTOR DEVICE WITH SOFT SWITCHING CHARACTERISTIC AND MANUFACTURING METHOD FOR SAME

(75) Inventor: Michio Nemoto, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 0 days.

(21) Appl. No.: 12/120,493

(22) Filed: May 14, 2008

(65) Prior Publication Data

US 2008/0315364 A1    Dec. 25, 2008

Related U.S. Application Data

(63) Continuation of application No. PCT/JP2006/322547, filed on Nov. 13, 2006.

(30) Foreign Application Priority Data

Nov. 14, 2005    (JP)    ............... 2005-329480

(51) Int. Cl.
  H01L 21/322    (2006.01)
  H01L 29/861    (2006.01)
(52) U.S. Cl. ................ 438/475; 257/139; 257/E21.317
(58) Field of Classification Search ................ 257/139, 257/E21.317, E21.328, E21.331, E29.107; 438/475, 530
See application file for complete search history.

(56) References Cited

U.S. PATENT DOCUMENTS

2003/0211694 A1* 11/2003 Takei et al. ................ 438/270

FOREIGN PATENT DOCUMENTS

| EP | 497290 A2 * | 8/1992 |
| EP | 0497290 A3 | 8/1992 |
| JP | 63-027083 A | 2/1988 |
| JP | 4-125933 A | 4/1992 |
| JP | 4-252078 A | 9/1992 |
| JP | 5-102161 A | 4/1993 |
| JP | 8-148699 A | 6/1996 |
| JP | 9-260639 A | 10/1997 |
| JP | 10-74959 A | 3/1998 |
| JP | 2001-127308 A | 5/2001 |

(Continued)

OTHER PUBLICATIONS

International search report issued in corresponding application No. PCT/JP2006/322547, dated Feb. 20, 2007.

(Continued)

Primary Examiner—Thomas L Dickey
(74) Attorney, Agent, or Firm—Rossi, Kimms & McDowell LLP

(57) ABSTRACT

After introducing oxygen into an N⁻ type FZ wafer serving as an N⁻ type first semiconductor layer, a P type second semiconductor layer and an anode are formed on a surface of the FZ wafer. The FZ wafer is irradiated with protons from the side of the anode, introducing crystal defects into the FZ wafer. By performing heat treatment to recover the crystal defects in the FZ wafer, the net doping concentration of a portion within the first semiconductor layer is made higher than the initial net doping concentration of the FZ wafer, and a desired broad buffer structure is formed. Accordingly, a semiconductor device with fast operation and low losses, and having soft switching characteristics, can be manufactured inexpensively using FZ bulk wafers, with good controllability and yields.

10 Claims, 33 Drawing Sheets

FOREIGN PATENT DOCUMENTS

| | | |
|---|---|---|
| JP | 2001-156299 A | 6/2001 |
| JP | 2001-326366 A | 11/2001 |
| JP | 2002-520885 A | 7/2002 |
| JP | 2003-249662 A | 9/2003 |
| JP | 2003-318412 A | 11/2003 |
| JP | 2005-64429 A | 3/2005 |
| WO | WO 00/04598 A2 | 1/2000 |

OTHER PUBLICATIONS

First office action issued in corresponding Chinese application No. 200680042224.2, dated Jun. 26, 2009. Partial translation provided.

* cited by examiner

FIG. 48

⊗: FORMED SATISFACTORILY  ○: MEASUREMENTS PARTIALLY INADEQUATE, BUT FORMATION SUCCESSFUL  △: INADEQUATE, SR MEASUREMENT VALUE SMALLER THAN CV MEASUREMENT VALUE (MOBILITY REDUCED)  X: NOT FORMED

Cell format: CV MEASUREMENT (upper-right) / SR MEASURMENT (lower-left)

| | IRRADIATED IONS | IRRADIATION AMOUNT (atoms/cm²) | IMMEDIATELY AFTER IRRADIATION | 300°C | 350°C | 400°C | 450°C | 500°C |
|---|---|---|---|---|---|---|---|---|
| WHEN INCLUDING OXYGEN (DW, CZ-FZ) | PROTONS | 10¹¹ | △ / ⊗ | ⊗ / ⊗ | ⊗ / ⊗ | ⊗ / ⊗ | ○ / ○ | X / X |
| | | 10¹² | △ / ⊗ | ⊗ / ⊗ | ⊗ / ⊗ | ⊗ / ⊗ | △ / ○ | X / X |
| | | 10¹³ | △ / ○ | ○ / ○ | ○ / ○ | ○ / ○ | △ / △ | △ / △ |
| | | 10¹⁴ | △ / ○ | ○ / ○ | ○ / ○ | ○ / ○ | ○ / ○ | ○ / ○ |
| | HELIUM | 10¹² | X / X | X / X | X / X | X / X | △ / X | △ / △ |
| WHEN NOT INCLUDING OXYGEN (FZ) | PROTONS | 10¹¹ | X / ⊗ | ⊗ / ⊗ | ⊗ / ⊗ | △ / ⊗ | X / X | X / X |
| | | 10¹² | X / ⊗ | ⊗ / ⊗ | ⊗ / ⊗ | △ / △ | X / △ | X / X |
| | | 10¹³ | X / ○ | ○ / ○ | ○ / ○ | ○ / ○ | ○ / ○ | ○ / ○ |
| | | 10¹⁴ | X / X | X / X | X / X | X / X | X / X | X / X |
| | HELIUM | 10¹² | X / X | X / X | X / X | X / X | X / X | X / X |

POWER SEMICONDUCTOR DEVICE WITH SOFT SWITCHING CHARACTERISTIC AND MANUFACTURING METHOD FOR SAME

CROSS REFERENCE TO RELATED APPLICATION

This application is a by-pass continuation application of, and claims priority from, PCT/JP2006/322547 filed Nov. 13, 2006, the content of which is incorporated herein by reference, which in turn claims priority from JP2005-329480 filed Nov. 14, 2005.

BACKGROUND

The invention relates to a diode or IGBT (insulated-gate bipolar transistor) or other semiconductor device, which has soft recovery characteristics in addition to high speed and low losses, and to a manufacturing method for such a device.

Semiconductor devices for use in power applications include diodes, IGBTs and similar devices in 600 V, 1200 V, 1700 V, and similar classes. Recently, there have been improvements in the characteristics of these devices. Power semiconductor devices are used in high-efficiency, power-conserving converter/inverters and other power conversion devices, and are indispensable for control of rotary motors and servomotors.

Such power control equipment is required to have low losses and consume less power, to operate at high speed and high efficiency, and to be environmentally friendly, that is, not to exert adverse effects on the surroundings. In response to such demands, a broad buffer structure for diodes has been proposed. In a broad buffer structure, the average concentration distribution in the $N^-$ drift layer has a peak (maximum value) substantially in the center of the layer, and decreases with a certain slope toward the anode and cathode directions (see, for example, Japanese Patent Application Laid-open No. 2003-318412, hereinafter referred to as "Patent Document 1").

A diode with a broad buffer structure can realize soft recovery characteristics and oscillation suppression in high-speed operation (for example, at carrier frequencies of 20 kHz and higher), which are difficult to attain by conventional technology to lower the emitter injection efficiency and control lifetime distribution (see, for example, Japanese Patent Application Laid-open No. 8-148699, hereinafter referred to as "Patent Document 2"). The following two methods have been disclosed in Patent Document 1 as methods for manufacturing diodes with such a broad buffer structure.

The first method is a method of using an epitaxial growth method to form a region with higher phosphorus concentration than the initial phosphorus concentration of the semiconductor substrate in a region deep in the bulk material, that is, a region 30 to 60 µm or deeper from the surface of the semiconductor chip. The second method is a method of irradiating a FZ (Float Zone) bulk wafer with protons ($H^+$) and performing heat treatment, to convert protons into donors in the vicinity of the proton range Rp within the bulk material. Because bulk wafers are less expensive than epitaxial wafers, the second method is less expensive than the first method.

In addition to the above Patent Document 1, various other methods have been proposed for forming high-concentration $N^+$ layers using proton donor techniques based on proton irradiation and heat treatment (see, for example, Japanese Patent Application Laid-open No. 9-260639, hereinafter referred to as "Patent Document 3" and Japanese Patent Application Laid-open No. 2001-156299, hereinafter referred to as "Patent Document 4"). In Patent Document 4, a method is disclosed in which oxygen thermal donors are used to form an $N^+$ layer. In addition, when there is a need to avoid proton donors, the use of helium in place of protons has been proposed (see, for example, Japanese Patent Application Laid-open No. 2003-249662 hereinafter referred to as "Patent Document 5").

Further, a method has been proposed, as a method of obtaining an inexpensive broad buffer structure, in which a high-concentration region is obtained within the bulk material by compensating the donor (phosphorus) concentration of the semiconductor substrate with acceptor atoms, as a net doping concentration (see, for example, Japanese Patent Application Laid-open No. 2005-64429, hereinafter referred to as "Patent Document 6"). A method in which proton irradiation is used to form defects in silicon substrate, and heat treatment is performed to adjust the residual defects to locally reduce lifetimes, is also well known (see for example Patent Document 5, Japanese Patent Application Laid-open No. 2001-326366, hereinafter referred to as "Patent Document 7", and Japanese Patent Application Laid-open No. 10-74959, hereinafter referred to as "Patent Document 8").

On the other hand, an IGBT manufacturing method in which a commonly used semiconductor substrate (for example a silicon wafer) is reduced in thickness by grinding or similar, ion implantation is performed from the ground surface to a prescribed concentration, and heat treatment is performed, to obtain IGBTs at low cost with low electrical losses (see for example, Published Japanese Translation of PCT Application No. 2002-520885, hereinafter referred to as "Patent Document 9"). In recent years, device development and manufacture using such low-cost methods have become the norm. Other diode structures include for example that of the diode disclosed in Japanese Patent Application Laid-open No. 2001-127308, hereinafter referred to as "Patent Document 10".

It is difficult to form a region with a higher donor concentration than the initial phosphorus concentration of a semiconductor substrate deep in the bulk material through ion implantation of phosphorus and arsenic as normal donor atoms. One reason for this is that even when phosphorus or arsenic is implanted into the semiconductor substrate at the normal accelerating voltage of 1 MeV, the range Rp is only about 1 µm, and so for practical purposes it is impossible to distribute the phosphorus or arsenic in a region of depth 30 µm or greater.

Hence as explained above, the only choices are to form a high-concentration donor region in the bulk material through compensation, or to form a high-concentration donor region in the bulk material by using atoms lighter than phosphorus or arsenic. Using a compensation method, diffusion must be performed over a long period of time at relatively high temperatures of around 1000° C. in order to cause for example aluminum, gallium, platinum, zinc, or similar, which are lighter than boron and have high diffusion constants, to reach a diffusion depth of 30 µm or greater.

In particular, when these atoms are introduced from the rear-surface side of the substrate, the wafer must be ground and polished to a thickness of approximately 100 µm, and atoms must be introduced by ion implantation from the polished face and diffused. Hence there are the problems that the thin wafer may break during handling, the ion-implanted face may be scratched due to foreign matter, or for other reasons a diffusion region with the desired concentration may not be formed.

On the other hand, in methods which use light atoms such as protons and helium, irradiation with charged particles and heat treatment are performed prior to grinding to make the wafer thin, so that the above-described breaking, scratching, and similar of the wafer can be reduced. However, because control of donor concentrations is difficult, there is a problem in that the desired concentration profile cannot easily be obtained.

For example, in Patent Document 3, a FZ wafer is irradiated with protons at an accelerating voltage of 10 MeV and a dose of $4\times10^{11}$ atoms/cm$^2$, to form an N$^+$ high-concentration layer (in Patent Document 3, a channel stop layer). The concentration in the N$^+$ high-concentration layer obtained is at most $2.5\times10^{14}$/cm$^3$, and the width of the low-resistance region in the vicinity of the range Rp is a broad 200 μm or greater.

On the other hand, for 600 V or 1200 V class devices, the width of the low-concentration N$^-$ drift layer in the above-described broad buffer structure is approximately 150 μm, narrower than the width (200 μm) of the low-resistance region. Hence using the method disclosed in Patent Document 3, an effective broad buffer structure cannot be formed.

In Patent Document 4 it is stated that the proton irradiation energy is 1 MeV or less, and that the heat treatment temperature is 300° C. or higher and 500° C. or lower. However, the proton irradiation energy for formation of the broad buffer structure is not described. Further, specific fabrication results are also not described. Hence it is unclear whether a broad buffer structure can actually be fabricated.

In Patent Document 5, it is stated that helium is more desirable than protons, and a reason cited for this is that upon irradiation with protons, the device breakdown voltage falls to approximately 60% of the normal value. However, the drop in breakdown voltage due to proton irradiation is due to the fact that a device with an ordinary conventional structure, rather than a broad buffer structure, is fabricated. Further, in Patent Document 5, the specific proton irradiation conditions and heat treatment conditions are not stated.

Moreover, upon comparing FIG. 3 in Patent Document 5 and FIG. 4 in the same reference, it is seen that compared with the device fabricated by helium irradiation with the desired profile of FIG. 4, the concentration in the high-concentration region of a device fabricated by proton irradiation in FIG. 3 is approximately four times the desired concentration, so that precise control is not achieved. Because in Patent Document 5, Patent Document 7, and Patent Document 8 there is no description whatsoever relating to conversion of protons into donors, the method of control for converting protons into donors remains unclear.

Results of experiments performed by the present inventors will now be explained. In these experiments, FZ-N type silicon wafers were irradiated with protons, and after performing heat treatment, the spreading resistance measurement method was used to directly evaluate concentration profiles. The wafer resistivity was 330 Ω-cm, and the phosphorus concentration was $1.4\times10^{13}$/cm$^3$. The proton irradiation energy was 7.9 MeV, and the dose was $1.0\times10^{12}$/cm$^2$. An aluminum absorber was used to cause the proton range to extend to a depth of approximately 50 μm from the silicon surface, that is, from the proton irradiation surface. On the proton irradiation surface, a thermal oxidation film approximately 10000 Å thick was formed.

Heat treatment conditions were 60 minutes at 350° C. and 60 minutes at 420° C. Under both conditions, annealing was performed in a nitrogen and hydrogen atmosphere. Samples fabricated in this way were affixed to a mount at an angle of 5°44', and were polished using a 1/20 diamond compound so that a wafer cross-section is exposed.

Spreading resistance of samples was measured using an SSM2000 by Solid State Measurement. Resistance values obtained in these measurements were converted into carrier concentrations, the results for which appear in FIG. 51 (heat treatment temperature: 350° C.) and FIG. 52 (heat treatment temperature: 420° C.). In both figures, the vertical axis indicates the carrier concentration, and the horizontal axis indicates the distance from the wafer surface (proton irradiation surface), that is, the depth.

From FIG. 51, upon annealing at 350° C. the average concentration of a wafer irradiated with protons ("after proton irradiation" in FIG. 51) in the vicinity of a depth of 50 μm from the surface is seen to be an order of magnitude lower than the concentration in the wafer without proton irradiation ("before proton irradiation" in FIG. 51). This is because numerous defects exist in the vicinity of the proton range, and consequently the resistivity is high in the region at this depth. Hence it is clear that a broad buffer structure such as that disclosed in Patent Document 1 is not obtained.

From FIG. 52, when annealing is performed at 420° C., there is more crystal recovery and resistivity is lower than upon annealing at 350° C., but in the vicinity of the proton range the average concentration in the proton-irradiated wafer ("after proton irradiation" in FIG. 52) is lower than the concentration in the wafer which has not been irradiates ("before proton irradiation" in FIG. 52), and so clearly a broad buffer structure is not obtained. In this way, using a well-known proton irradiation and heat treatment method, it is difficult to form the desired broad buffer structure.

SUMMARY OF THE INVENTION

In order to resolve the above-described problems of the prior art, the invention provides a broad buffer structure diode, IGBT, or other power semiconductor device, with fast operation and low losses, and which has soft switching characteristics. The invention also provides a manufacturing method for a semiconductor device, which is a broad buffer structure diode, IGBT, or other power semiconductor device, with fast operation and low losses, and which has soft switching characteristics, inexpensively, with good controllability and good yields, using FZ bulk wafers.

A semiconductor device in accordance with the invention has a second semiconductor layer of a second conduction type on the side of a first main face of a first semiconductor layer of a first conduction type. Further, the semiconductor device has a third semiconductor layer of the first conduction type on the side of a second main face of the first semiconductor layer. The second semiconductor layer and the third semiconductor layer have higher concentrations than the first semiconductor layer.

In the first semiconductor layer, there exists at least one location at which the impurity concentration in the first semiconductor layer is a maximum. Further, the impurity concentration in the first semiconductor layer decreases from the location of the maximum impurity concentration toward both the second semiconductor layer and the third semiconductor layer. And, the location of the maximum impurity concentration comprises oxygen atoms and atoms lighter than oxygen. In the invention, the atoms lighter than oxygen may be hydrogen atoms.

By means of a semiconductor device of the invention, due to the existence of complex donors comprising oxygen atoms and atoms lighter than oxygen in the location of the maximum impurity concentration of the first semiconductor layer, the desired broad buffer structure is formed. Further, the desired broad buffer structure is formed by complex donors comprising oxygen atoms and hydrogen atoms.

Further, a semiconductor device manufacturing method of the invention comprises a process, when manufacturing a semiconductor device with the above-described structure, of introducing oxygen into a semiconductor substrate of a first conduction type. The semiconductor substrate serves as a first semiconductor layer of the first conduction type. A next process of irradiating a first main face or second main face of the semiconductor substrate with charged particles is also comprised. By this means, crystal defects are introduced into the first semiconductor layer. Next, heat treatment is performed. By this means, there is recovery from crystal defects, and the net doping concentration of a portion within the first semiconductor layer is higher than the initial net doping concentration of the semiconductor substrate.

In the present invention, after introducing oxygen, and after forming a second semiconductor layer on the first main face of the semiconductor substrate, charged particle irradiation may be performed. In this case, after inducing crystal defect recovery by means of heat treatment, the second main face of the semiconductor substrate may be ground, and a third semiconductor layer may be formed on the face exposed by grinding. Or, a first conduction type impurity may be introduced into the semiconductor substrate together with oxygen to form a third semiconductor layer, and after forming the second semiconductor layer on the face on the opposite side, charged particle irradiation may be performed.

Whichever method is used, the charged particles may be protons, and the dose may be $1\times10^{11}$ atoms/cm$^2$ or greater and $1\times10^{14}$ atoms/cm$^2$ or less. Further, the heat treatment temperature may be 250° C. or higher and 500° C. or lower, and preferable 300° C. or higher and 450° C. or lower, and still more preferably 350° C. or higher and 420° C. or lower.

By means of a semiconductor device manufacturing method of this invention, complex donors comprising oxygen atoms and atoms lighter than oxygen, such as hydrogen atoms, can be made to exist in a first semiconductor layer, and by this means the desired broad buffer structure can be formed. Further, by means of complex donors comprising oxygen atoms and hydrogen atoms, the desired broad buffer structure can be formed. If the heat treatment temperature is lower than 250° C. or is higher than 500° C., complex donors do not occur, due to the need to balance a temperature for oxygen donor conversion (450 to 500° C.) with the extent of recovery from defects due to the irradiation with protons and similar.

By means of a semiconductor device of the present invention, a diode, IGBT, or similar with a broad buffer structure, with fast operation and low losses, and having soft switching characteristics, is obtained. Further, by means of a semiconductor device manufacturing method of the present invention, diode, IGBT, or similar with a broad buffer structure, with fast operation and low losses, and having soft switching characteristics, can be manufactured inexpensively, with good controllability and good yields, using FZ bulk wafers.

BRIEF DESCRIPTION OF THE DRAWINGS

The invention will be described in greater detail with reference to certain preferred embodiments and the accompanying drawings, wherein:

FIG. 48 is a table summarizing the circumstances of formation of the broad buffer layer in the semiconductor devices of Embodiment 7;

DETAILED DESCRIPTION OF THE PREFERRED EMBODIMENTS OF THE INVENTION

Semiconductor devices and manufacturing methods for such semiconductor devices in preferred embodiments of the invention are explained in detail below with reference to the attached drawings. In this Specification and the attached drawings, "N" and "P" denoting layers and regions indicate that the majority carriers are electrons and holes respectively. Further, "+" and "−" appended to "N" and "P" indicate that the impurity concentrations are relatively high and low respectively. In the following explanations of embodiments and attached drawings, the same symbols are used to denote similar configurations, and redundant explanations are omitted.

Embodiment 1

Figure 1:
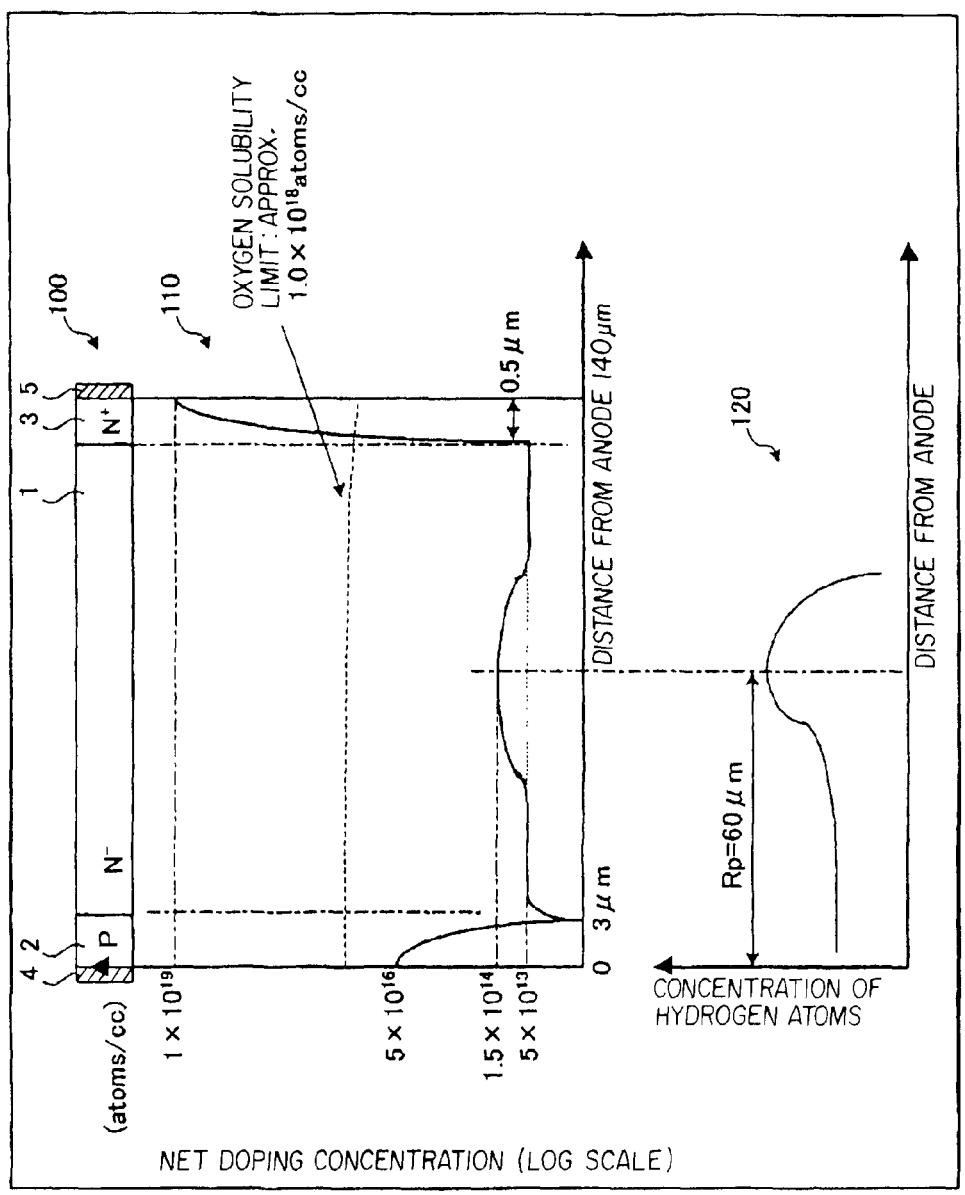
FIG. 1 shows the configuration of the semiconductor device of Embodiment 1 of the invention, the net doping concentration, and the proton distribution.

FIG. 1 shows the configuration of the semiconductor device of Embodiment 1 of the invention, the net doping concentration, and the distribution of hydrogen atoms. In FIG. 1, a P-type second semiconductor layer 2, serving as a P anode layer, is formed on one main face of an N-type first semiconductor layer 1, serving as an N⁻ drift layer, as shown in cross-sectional view 100 of the semiconductor device. Further, an N-type third semiconductor layer 3, serving as an N⁺ cathode layer, is formed on the other main face of the first semiconductor layer 1. And, on the surface of the second semiconductor layer 2, an anode 4 is formed. And on the surface of the third semiconductor layer 3, a cathode 5 is formed.

As shown in the characteristic diagram 110 for the distance from the anode and the net doping concentration (log scale) in FIG. 1, the net doping concentration in the first semiconductor layer 1 has a peak substantially in the center of the first semiconductor layer 1, and decreases with a certain slope toward the second semiconductor layer 2 and third semiconductor layer 3. That is, the semiconductor device of Embodiment 1 has a broad buffer structure. The net doping concentrations of the second semiconductor layer 2 and third semiconductor layer 3 are both higher than the net doping concentration in the first semiconductor layer 1.

As an example, net doping concentrations and dimensions are described for a case in which a semiconductor device of Embodiment 1 is fabricated with breakdown voltage in the 1200 V class, with a rated current of 150 A, and with a chip size of 10 mm×10 mm. Dimensions are with reference to the interface between the second semiconductor layer 2 and the anode 4, and unless stated otherwise, refer to the distance from this interface.

The distance to the interface between the second semiconductor layer 2 and first semiconductor layer 1 is 3 μm. The distance to the interface between the third semiconductor layer 3 and cathode 5 is 140 μm. The distance from the interface between the first semiconductor layer 1 and third semiconductor layer 3 to the interface between the third semiconductor layer 3 and cathode 5, that is, the thickness of the third semiconductor layer 3, is 0.5 μm.

The net doping concentration in the second semiconductor layer 2 is $5 \times 10^{16}$ atoms/cc at the interface with the anode 4, and decreases toward the first semiconductor layer 1, reaching $5 \times 10^{13}$ atoms/cc at the interface with the first semiconductor layer 1. The net doping concentration in the first semiconductor layer 1 is lower than $5 \times 10^{13}$ atoms/cc at the interface with the second semiconductor layer 2, but becomes $5 \times 10^{13}$ atoms/cc in the vicinity of the interface with the second semiconductor layer 2. Below, atoms/cc and atoms/cm$^3$ are used as units indicating concentration, but "cc" and "cm$^3$" are identical.

The net doping concentration at the location of the peak substantially in the center of the first semiconductor layer 1 is $1.5 \times 10^{14}$ atoms/cc. The net doping concentration in the first semiconductor layer 1 at and in the vicinity of the interface with the third semiconductor layer 3 is $5 \times 10^{13}$ atoms/cc. The net doping concentration in the third semiconductor layer 3 is $5 \times 10^{13}$ atoms/cc at the interface with the first semiconductor layer 1, and becomes higher toward the cathode 5, reaching $1 \times 10^{19}$ atoms/cc at the interface with the cathode 5.

As indicated in the characteristic diagram 120 for the distance from the abode and the proton distribution in FIG. 1, the distance to the location at which the net doping concentration in the first semiconductor layer 1 peaks is 60 μm. This distance is equal to the proton range Rp when the surface of the second semiconductor layer 2 is irradiated with protons in the manufacturing stage. The proton concentration is high in the vicinity of this proton range Rp. Oxygen atoms are introduced into the first semiconductor layer 1, and the desired broad buffer structure is formed by means of complex donors comprising oxygen atoms and hydrogen atoms.

Figure 2:
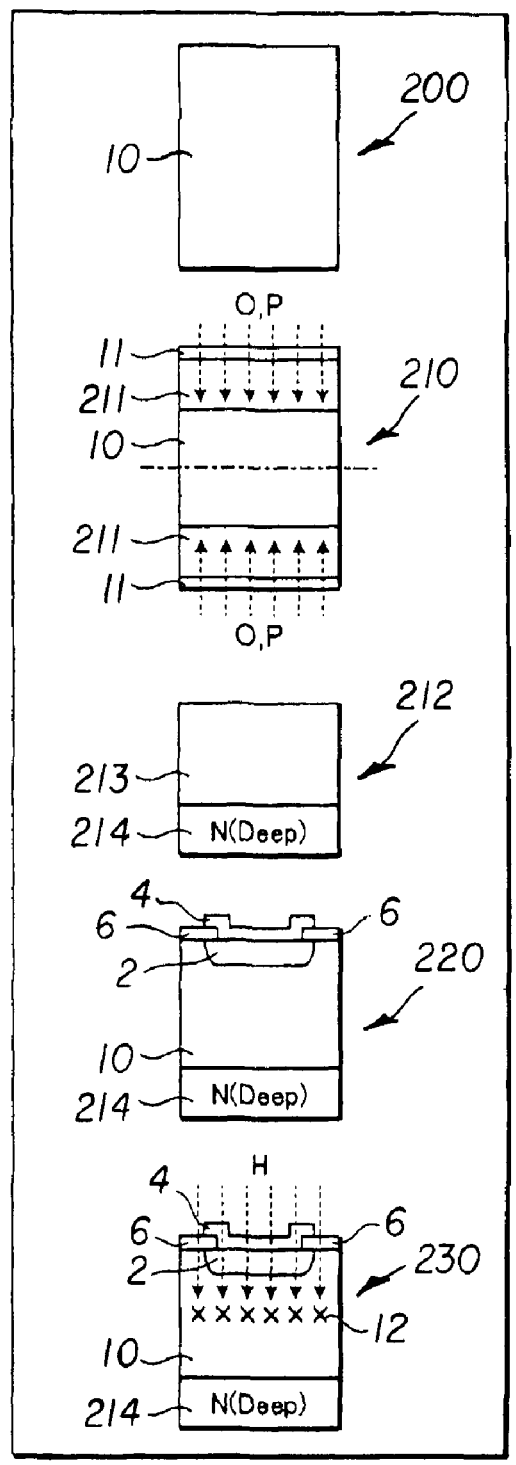
FIG. 2 shows processes to manufacture the semiconductor device of Embodiment 1 of the invention.
Figure 3:
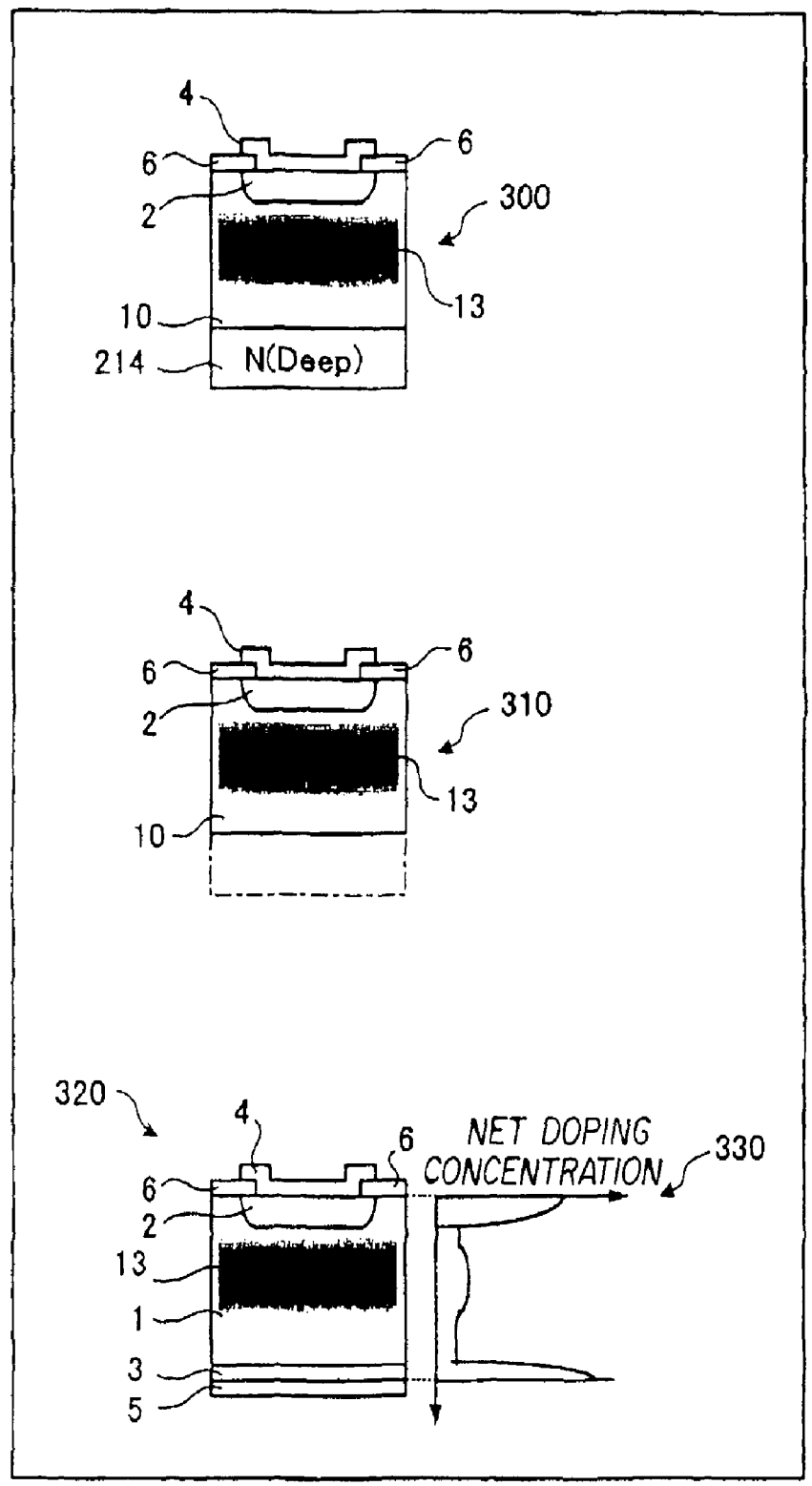
FIG. 3 shows processes to manufacture the semiconductor device of Embodiment 1 of the invention.

Next, processes to manufacture the semiconductor device of Embodiment 1 are explained. Here, as one example, a case is explained in which a semiconductor device having the dimensions and net doping concentration shown in FIG. 1 is manufactured (breakdown voltage in the 1200 V class, rated current 150 A). FIG. 2 and FIG. 3 show manufacturing processes. First, as shown in cross-sectional view 200 of FIG. 2, an FZ wafer 10 of resistivity 40 to 120 Ω-cm, for example 90 Ω-cm (phosphorus concentration $5.0 \times 10^{13}$ atoms/cc), is prepared as the semiconductor substrate.

As shown in cross-sectional view 210 in FIG. 2, phosphorus glass 11 is applied to both faces of this FZ wafer 10, and heat treatment is performed at for example 1250° C. for 100 hours in an atmosphere of nitrogen and oxygen, to cause diffusion of the phosphorus (P) from both faces. By means of this heat treatment, a large amount of oxygen (O) is introduced into the wafer from both faces of the FZ wafer 10, and the oxygen concentration in the FZ wafer 10 reaches the solid solution limit concentration (approximately $1 \times 10^{18}$ atoms/cc).

Next, as indicated by the dot-dash line in cross-sectional view 210, the FZ wafer 10 is ground, and the high-concentration phosphorus diffusion layers 211 at the wafer surface are removed. By this means, as shown in cross-sectional view 212 in FIG. 2, a thin wafer 213 having a third semiconductor layer 214 comprising a high-concentration phosphorus layer 211 is obtained. One of the surfaces of this thin wafer 213 is polished to a mirror finish. On the mirror-finished face of this FZ wafer 10, a second semiconductor layer 2, a guard ring edge structure, and an anode 4 are formed in subsequent diode processes. The thickness of the FZ wafer 10 is selected in advance such that the thickness after this grinding and polishing is for example 500 μm.

The resistivity of the mirror-finished face of the FZ wafer 10 is for example 90 Ω-cm. The other surface of the FZ wafer 10 remains in the state in which the phosphorus glass 11 has been removed. The surface concentration at this face is for example approximately $1 \times 10^{20}$ atoms/cm3, and high-concentration phosphorus is diffused to a depth of for example approximately 80 μm.

Next, as shown in cross-sectional view 220 in FIG. 2, the second semiconductor layer 2 serving as a P anode layer, a guard ring edge structure, not shown, an insulating film 6, and an anode 4 are formed using standard diode processes. The concentration in the second semiconductor layer 2 is for example $5 \times 10^{16}$ atoms/cc, and the depth is for example 3 μm. The material of the anode 4 is for example Al—Si 1%.

Next, as shown in cross-sectional view 230 in FIG. 2, the FZ wafer 10 is irradiated from the side of the anode 4 with protons accelerated by a cyclotron. Here the accelerating voltage of the cyclotron is for example 7.9 MeV, and the proton dose is for example $1.0 \times 10^{12}$ atoms/cm$^2$. An aluminum absorber is used, adjusting the thickness such that the proton range is 60 μm from the interface between the semiconductor of the FZ wafer 10 and the anode 4. In the cross-sectional view 230, x symbols represent crystal defects 12 occurring within the FZ wafer 10 due to proton irradiation.

Next, as shown in cross-sectional view 300 in FIG. 3, heat treatment is performed at for example 350° C. for 1 hour in a hydrogen atmosphere, to cause recovery of crystal defects 12. By this means, a high-concentration region 13 is formed, centered at a depth of approximately 60 μm from the interface between the semiconductor of the FZ wafer 10 and the anode 4. By means of this high-concentration region 13, the desired broad buffer structure is formed.

Next, as shown in cross-sectional view 310 in FIG. 3, grinding and wet etching of the face of the FZ wafer 10 remaining in the state in which the phosphorus glass 11 has been removed is performed, such that the FZ wafer 10 is of prescribed thickness. In the case of a 1200 V class device, at this stage the thickness of the FZ wafer 10 is typically 100 to 160 μm. In Embodiment 1, the thickness of the FZ wafer 10 at this stage is for example 140 μm Next, ion implantation of phosphorus or another N-type impurity into the face of the FZ wafer 10 which has been ground and wet-etched is performed. The accelerating voltage at this time is for example 50 keV, and the dose is for example $1 \times 10^{15}$ atoms/cm$^2$. Next, the ion-implanted face is irradiated with laser light from a YAG second-harmonic laser or other laser using a double-pulse method.

Here, the double-pulse method is a method in which irradiation is performed continuously using a plurality of laser pulses from a plurality of laser irradiation devices, with the irradiation timing shifted by a prescribed delay time for each pulse, for each laser light irradiation area. The double-pulse method is explained in detail in Japanese Patent Laid-open No. 2005-223301.

The energy density when performing laser light irradiation using the double-pulse method is, in total for each laser light irradiation area, for example, 3 J/cm$^2$. The double-pulse delay time is for example 300 nsec. By means of this laser irradiation, the phosphorus or other N-type impurities which had been ion-implanted are electrically activated, and a third semiconductor layer 3 serving as the N$^+$ cathode layer is obtained.

Finally, as shown in cross-sectional view 320 in FIG. 3, metals are deposited on the surface of the third semiconductor layer 3 in the order titanium, nickel, and gold, to form a cathode 5 as an Ohmic contact with the third semiconductor layer 3, to complete the semiconductor device (diode). The portion of the FZ wafer 10 between the second semiconductor layer 2 and the third semiconductor layer 3 becomes the first semiconductor layer 1. The characteristic diagram 330 in FIG. 3 is a profile of the net doping concentration corresponding to the semiconductor device of the cross-sectional view 320.

Here, experimental results conducted by these inventors are explained. In these experiments, oxygen was introduced into FZ-N type silicon wafers by the same manufacturing processes as in FIG. 2, an oxide film of thickness 1000 Å was formed on the wafer surface, and proton irradiation of the surface was performed. The wafer resistivity was 330 Ω-cm, and the phosphorus concentration was $1.4\times10^{13}/cm^3$. The proton irradiation energy was 7.9 MeV, and the dose was $1.0\times10^{12}/cm^2$.

Thereafter, heat treatment in a hydrogen atmosphere was performed. The heat treatment conditions were 350° C. and 60 minutes, and 420° C. and 60 minutes. Samples obtained were affixed to a mount at an angle of 5°44', and were polished using a ½₀ diamond compound so that a wafer cross-section is exposed. Spreading resistance measurements of the exposed face were performed using an SSM2000 by Solid State Measurement.

Figure 4:
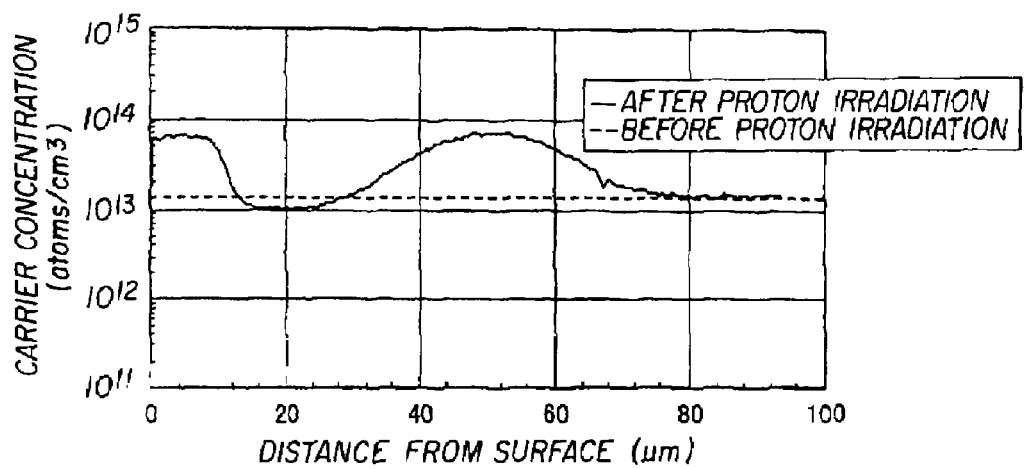
FIG. 4 shows the concentration profiles in a wafer due to proton irradiation and due to heat treatment at 350° C. in Embodiment 1.
Figure 5:
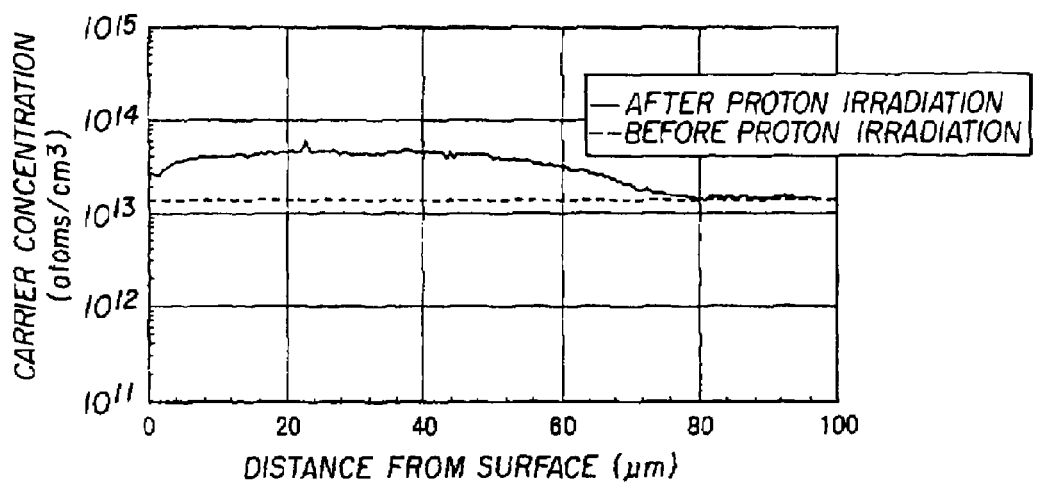
FIG. 5 shows the concentration profiles in a wafer due to proton irradiation and due to heat treatment at 420° C. in Embodiment 1.

The result of converting resistance values obtained in measurements into carrier concentrations appear in FIG. 4 (heat treatment temperature 350° C.) and FIG. 5 (heat treatment temperature 420° C.). In both figures, the vertical axis indicates the carrier concentration, and the horizontal axis indicates the distance from the wafer surface (proton irradiation face).

From FIG. 4 it is seen that upon annealing at 350° C., the average concentration in the wafer irradiated with protons ("after proton irradiation" in FIG. 4) in the vicinity of a depth of 50 μm from the surface is higher than the concentration in a wafer not irradiated with protons ("before proton irradiation" in FIG. 4), that is, higher than the initial concentration in the wafer, and that the desired broad buffer structure is obtained. In FIG. 4, the presence of a high-concentration region (low-resistance region) from the wafer surface to a depth of approximately 15 μm is due to diffusion of oxygen from the oxide film.

From FIG. 5, when annealing is performed at 420° C., a high-concentration region with higher concentration than the initial wafer concentration extends to a depth exceeding 60 μm from the wafer surface. This is attributed to the fact that the oxygen and hydrogen atoms have been diffused by the heat treatment at 420° C.

Figure 6:
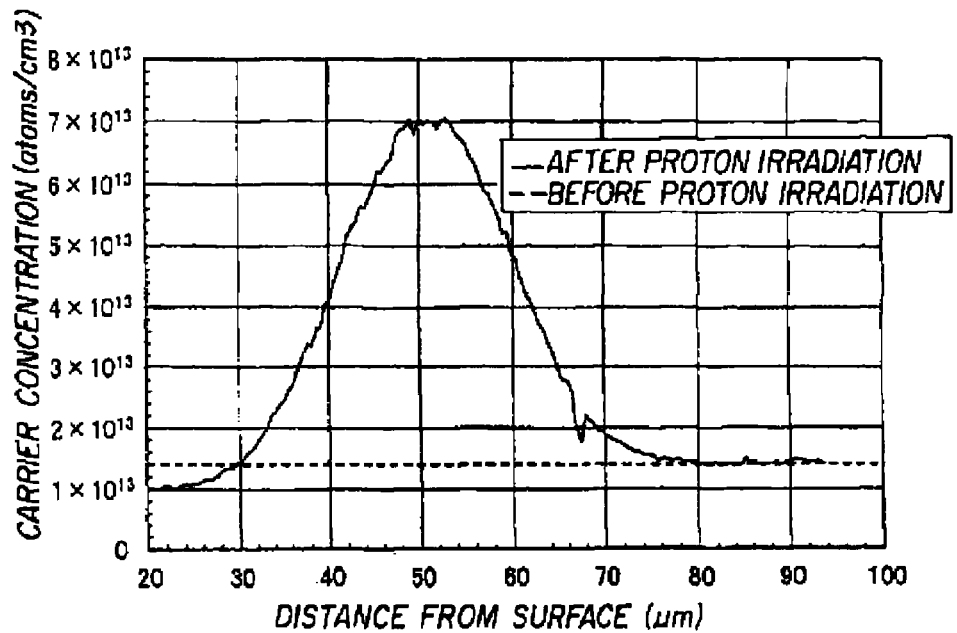
FIG. 6 shows the concentration profiles in a wafer due to proton irradiation and due to heat treatment at 350° C. in Embodiment 1.

FIG. 6 is the result of converting the log scale of the vertical axis of FIG. 4 into linear scale. As shown in FIG. 6, the distribution of the carrier concentration (net doping concentration) is not smooth, and local changes in concentration occur. This is due to the presence of measurement scattering in spreading resistance measured values, and to the fact that residual damage (defects) caused by proton irradiation remain locally in the silicon, and that these defects cause a reduction in carrier mobility.

Even in the broad buffer structure of Embodiment 1, physical changes in the logical net doping concentration occur, similarly to those described in FIG. 77 of Patent Document 1.

However, as described in Patent Document 1, the pinning effect on space charge penetration in the reverse recovery characteristic and the breakdown voltage characteristic are determined by the electric field intensity distribution. This electric field intensity distribution is proportional to the volume integral of the net doping concentration.

For this reason, such local changes in concentration, such as for example a change of approximately 10% in the net doping concentration at a certain position, may be ignored. Hence in this Specification, "broad buffer structure" means a structure which comprises such small changes in concentration, with the average concentration distribution decreasing with a certain slope from a local peak value toward the anode and cathode.

Figure 7:
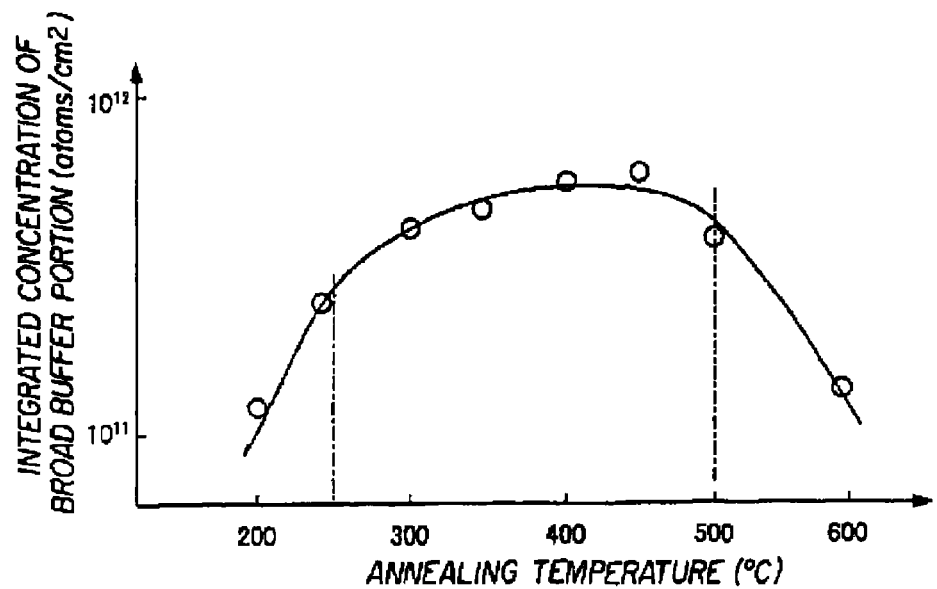
FIG. 7 shows the relation between the annealing temperature after proton irradiation and the integrated concentration in the broad buffer portion in Embodiment 1.

FIG. 7 shows the relation between the annealing temperature after proton irradiation and the integrated impurity concentration in the broad buffer portion. The proton dose is $1\times10^{12}$ atoms/cm². Here, the integrated concentration in the broad buffer portion is the value calculated by the same method as the calculation method disclosed in paragraphs "0023" and "0024" in Patent Document 1, and determines the reverse recovery characteristic and other parameters. According to Patent Document 1, it is desirable that this value be $8\times10^{11}$ atoms/cm² or lower.

From FIG. 7, if the annealing temperature is lower than 250° C. or higher than 500° C., the integrated concentration decreases rapidly. This is inferred to occur because at temperatures below 250° C. or higher than 500° C., due to the balance required between the temperature for conversion of oxygen to donors (450 to 500° C.) and the extent of recovery of defects caused by protons, complex donors are not generated. Hence it is desirable that the annealing temperature be 250° C. or higher and 500° C. or lower.

Figure 8:
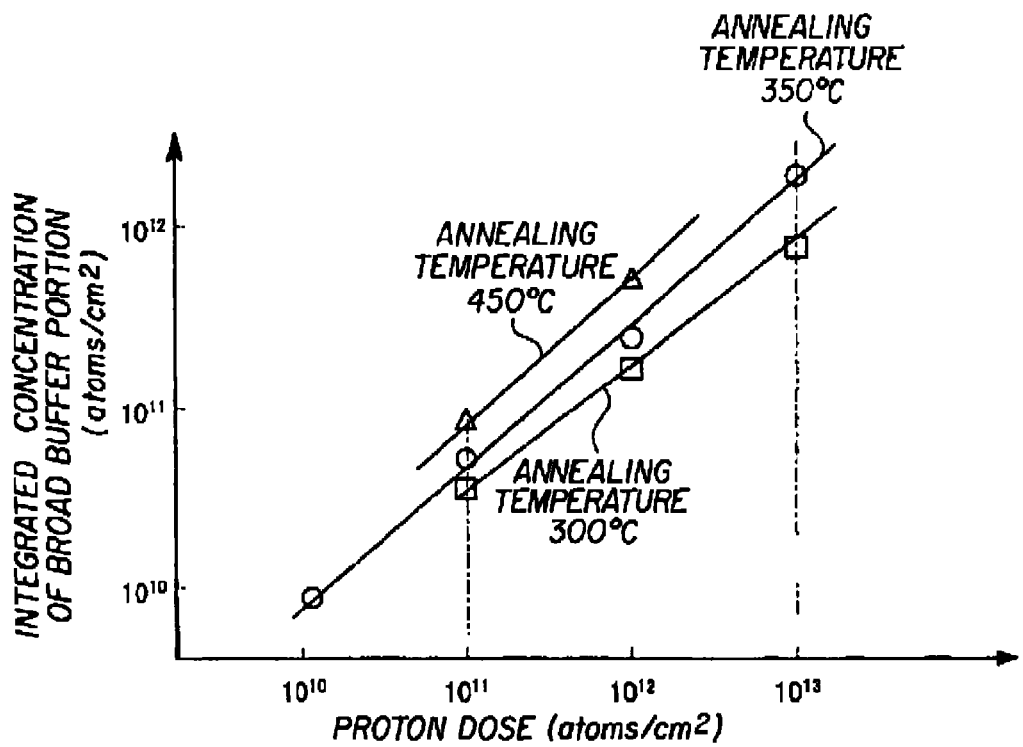
FIG. 8 shows the relation between the annealing temperature after proton irradiation, the dose, and the integrated concentration in the broad buffer portion in Embodiment 1.

FIG. 8 shows the relation between annealing temperature after proton irradiation, proton dose, and integrated impurity concentration of the broad buffer portion. As explained above, due to the facts that an integrated concentration in the broad buffer portion of $8\times10^{11}$ atoms/cm² or less is desirable and that an annealing temperature between 250 and 500° C. is desirable, in order to form the desired broad buffer structure, it is desirable that the proton dose be $1\times10^{11}$ atoms/cm² or higher and $1\times10^{13}$ atoms/cm² or lower.

Figure 51:
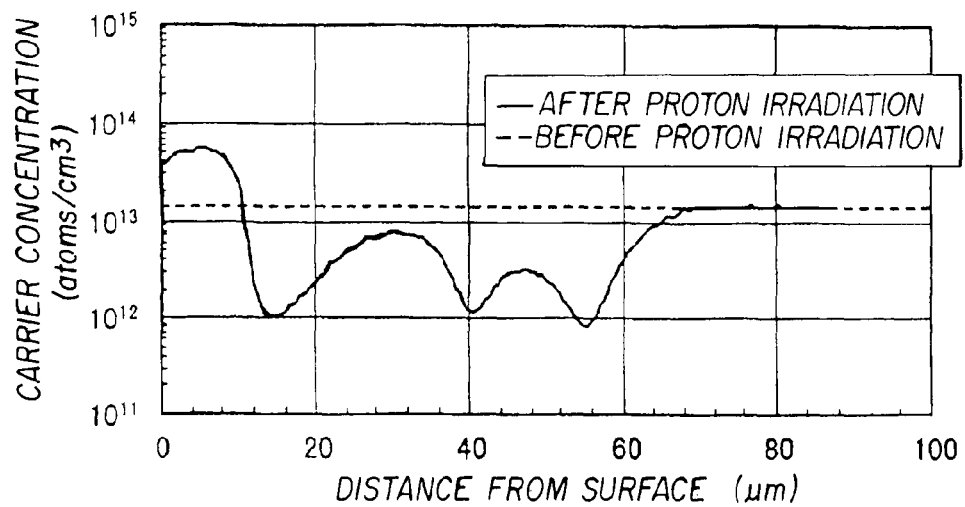
FIG. 51 shows wafer concentration profiles due to proton irradiation and due to heat treatment at 350° C. in the prior art; and, FIG. 52 shows wafer concentration profiles due to proton irradiation and due to heat treatment at 420° C. in the prior art.
Figure 52:
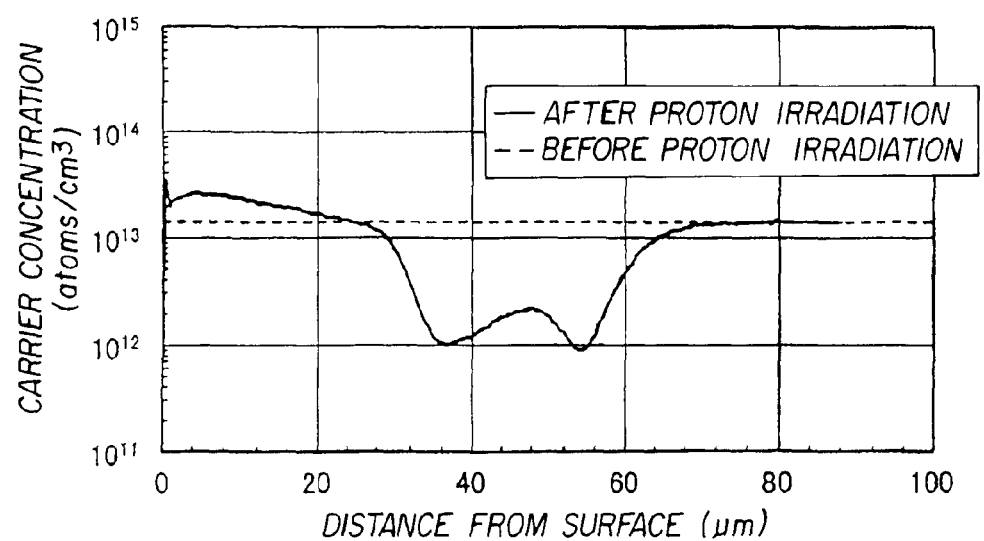

From the above explanation as well as comparison of FIG. 4 and FIG. 5 with FIG. 51 and FIG. 52, in order to form a broad buffer structure, not only must hydrogen atoms be introduced into the substrate by proton irradiation, but clearly it is also extremely important that oxygen be included in the substrate.

Further, in order that interaction with oxygen resulting from heat treatment result in complex donors, irradiation with atoms lighter than oxygen is important. Hence as atoms for irradiation, among H, He, Li, Be, and B, H and He are preferable, and in particular H (protons) is desirable. These atoms are ionized and used in irradiation.

Figure 9:
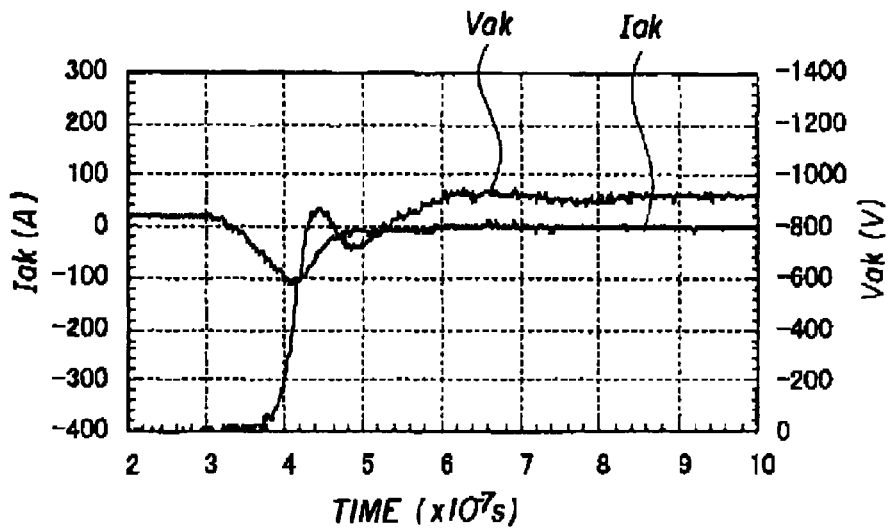
FIG. 9 shows the reverse recovery waveform of the diode of Embodiment 1.
Figure 10:
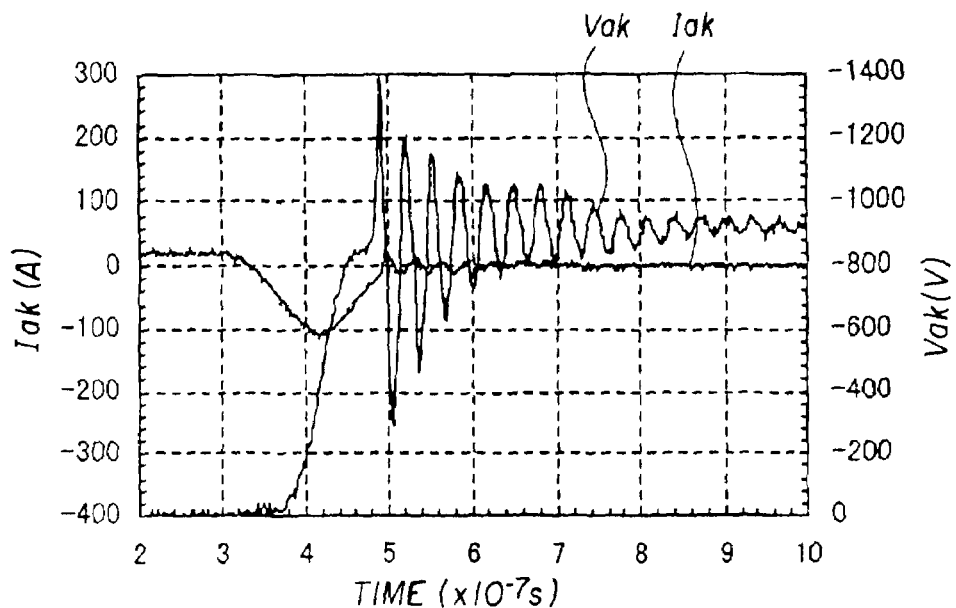
FIG. 10 shows the reverse recovery waveform of a conventional diode.
Figure 11:
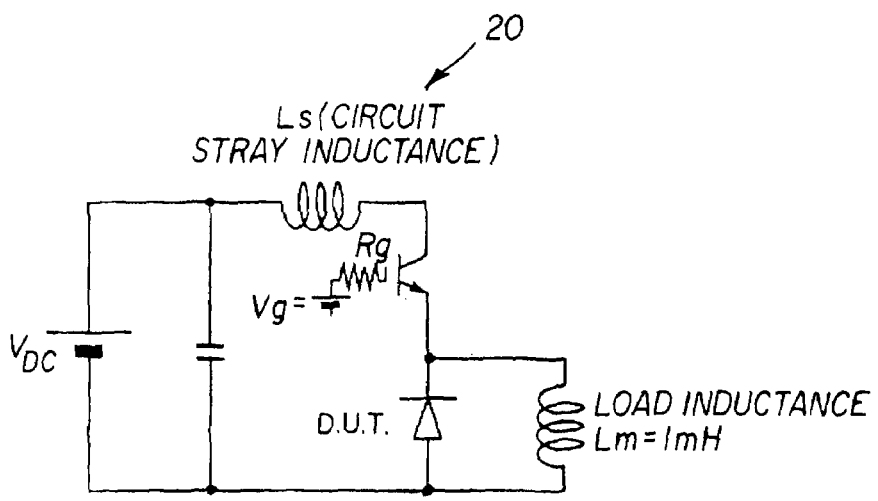
FIG. 11 shows the configuration of a single-phase chopper circuit.

FIG. 9 shows the reverse recovery waveform at room temperature of the diode of FIG. 1; FIG. 10 shows the reverse recovery waveform at room temperature of the diode disclosed in Patent Document 9. In these figures, Iak is the anode current, and Vak is the anode-cathode voltage. In both cases, the waveforms diagrams are of waveforms in the single-phase chopper circuit 20 shown in FIG. 11.

In the single-phase chopper circuit 20, the reverse recovery forward current is 15 A, or 1/10 the rated current, the DC bus voltage is 900 V, and the load inductance Lm is 1 mH. The switching IGBT is a standard 1200 V/150 A FS (Field Stop) IGBT, the gate resistance of which is 0Ω at the on side and 33Ω at the off side. The circuit stray inductance Ls of the main circuit is 200 nH. As is clear from FIG. 9 and FIG. 10, even in the lowest-cost diode fabricated using an FZ wafer with greatest recovery of crystal defects, formation of a broad buffer structure using oxygen and protons, as in this Embodiment 1, results in soft recovery with no oscillation.

Embodiment 2

Figure 12:
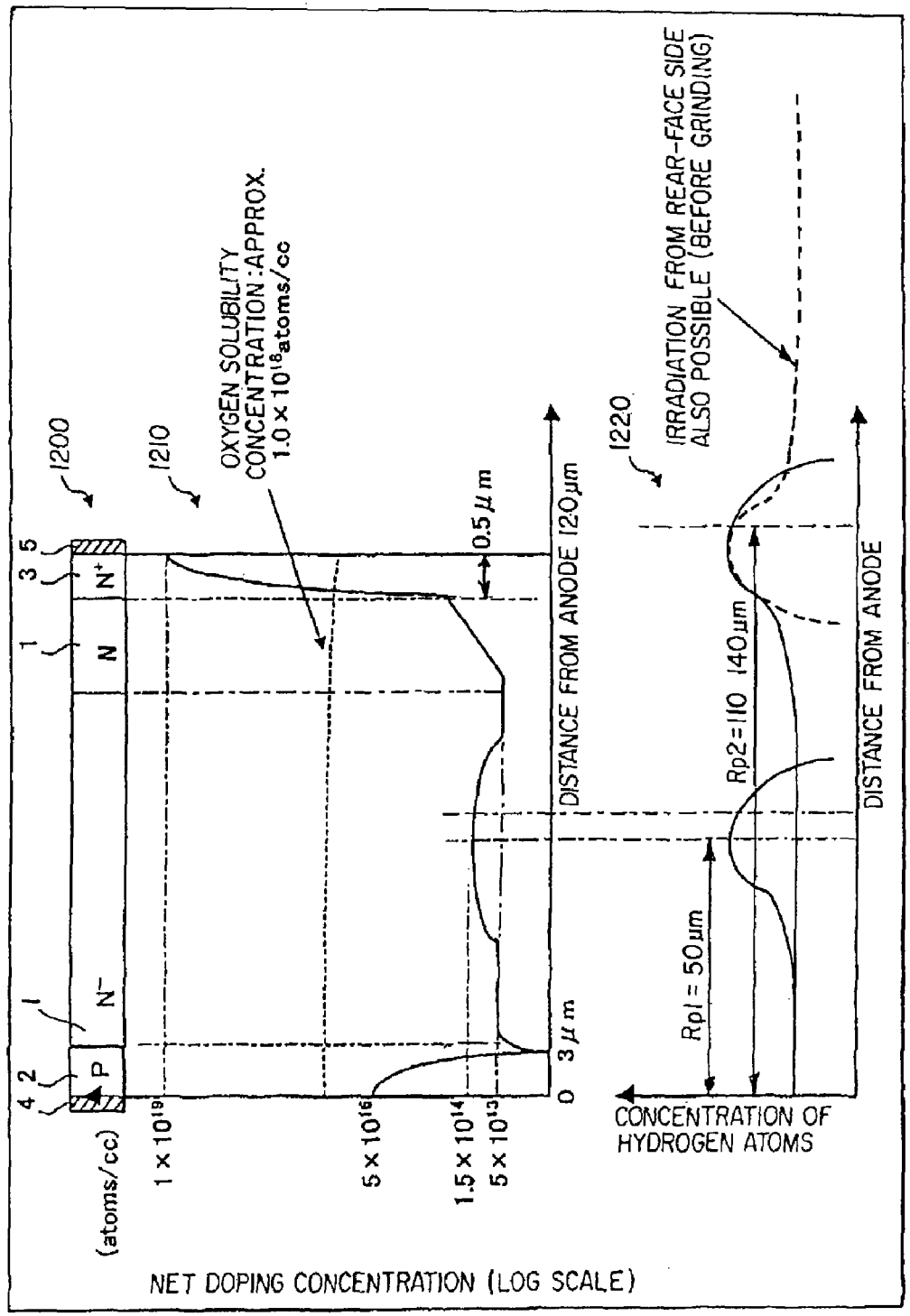
FIG. 12 shows the configuration of the semiconductor device of Embodiment 2 of the invention, the net doping concentration, and the proton distribution.

FIG. 12 shows the configuration of the semiconductor device of Embodiment 2 of the invention, the net doping concentration, and the proton distribution. As shown in cross-sectional view 1200 of the semiconductor device in FIG. 12, the semiconductor device of Embodiment 2 is the semiconductor device of Embodiment 1 shown in FIG. 1, with a fourth semiconductor layer 7, serving as an N cathode buffer layer, with higher concentration than the first semiconductor layer 1 and lower concentration than the third semiconductor layer 3, provided between the first semiconductor layer 1 and the third semiconductor layer 3. Otherwise the configuration is the same as in Embodiment 1, and so the same symbols are assigned, and explanations are omitted.

As an example, the net doping concentrations and dimensions of various portions of a semiconductor device of Embodiment 2 are described. However, only values different from those of the example of Embodiment 1 are explained. As shown in the characteristic diagram 1210 for the distance from the anode and the net doping concentration (log scale) in FIG. 12, the net doping concentration in the fourth semiconductor layer 7 is $5 \times 10^{13}$ atoms/cc at the interface with the first semiconductor layer 1, and is higher toward the third semiconductor layer 3.

The net doping concentration in the third semiconductor layer 3 is higher from the interface with the fourth semiconductor layer 7 toward the cathode 5, and is $1 \times 10^{19}$ atoms/cc at the interface with the cathode 5. The distance to the interface between the third semiconductor layer 3 and the cathode 5 is 120 µm.

As shown in characteristic diagram 1220 for the distance from anode concentration of hydrogen atoms in FIG. 12, the distance to the location in the first semiconductor layer 1 at which the net doping concentration peaks is 50 µm, and the proton concentration is high near this location. The concentration of hydrogen atoms is high in the region at depths from 110 to 140 µm.

The high concentration of hydrogen atoms near a depth of 50 µm occurs because a broad buffer structure is formed. The high concentration of hydrogen atoms in the region at a depth of 110 to 140 µm is due to formation of the fourth semiconductor layer 7. Despite the fact that the distance to the interface between the third semiconductor layer 3 and the cathode 5 is 120 µm, the hydrogen concentration is high in the region at depths of 110 to 140 µm; as explained below, this is because in the manufacturing stage the wafer prior to grinding, at thickness 120 µm, is irradiated with protons such that the range is 110 to 140 µm.

In this way, by providing a fourth semiconductor layer 7, when the semiconductor device is reverse-biased and the depletion layer extends toward the third semiconductor layer 3, the depletion layer can be prevented from reaching the third semiconductor layer 3. The thickness of the third semiconductor layer 3 is only about 0.5 µm. Hence when forming the third semiconductor layer 3, if the third semiconductor layer 3 is not formed perfectly due to shielding of implanted ions by particles, scratches and similar, without the fourth semiconductor layer 7 the first semiconductor layer 1 would be in direct contact with the cathode 5, and the leakage current would increase. By providing a fourth semiconductor layer 7, such phenomena can be prevented.

Figure 13:
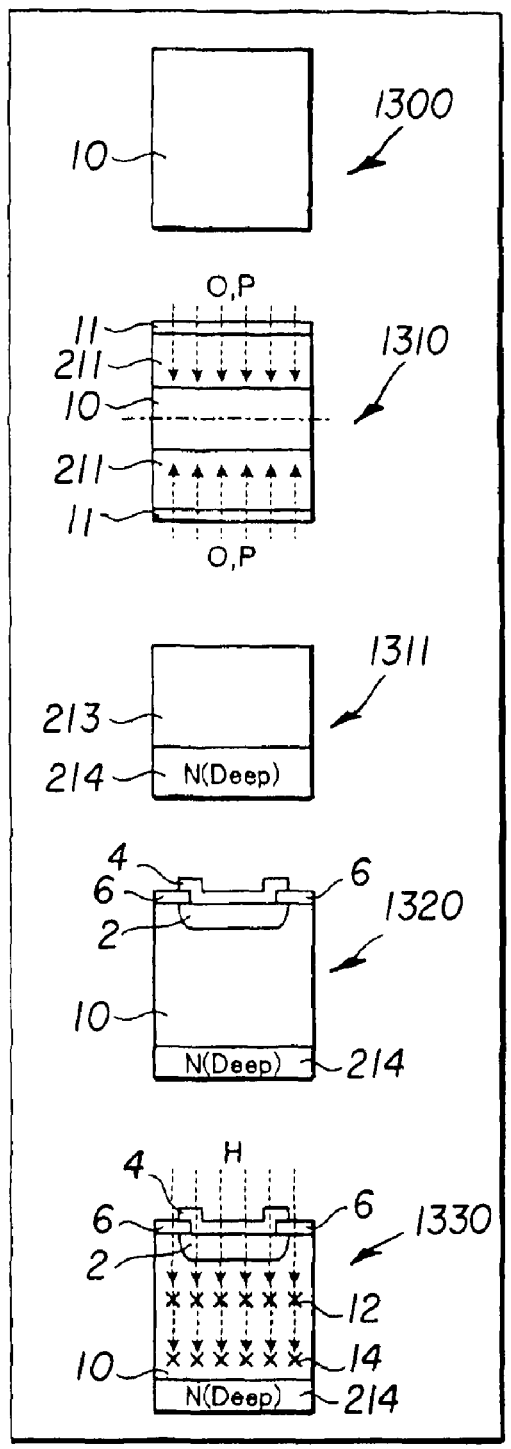
FIG. 13 shows processes to manufacture the semiconductor device of Embodiment 2 of the invention.
Figure 14:
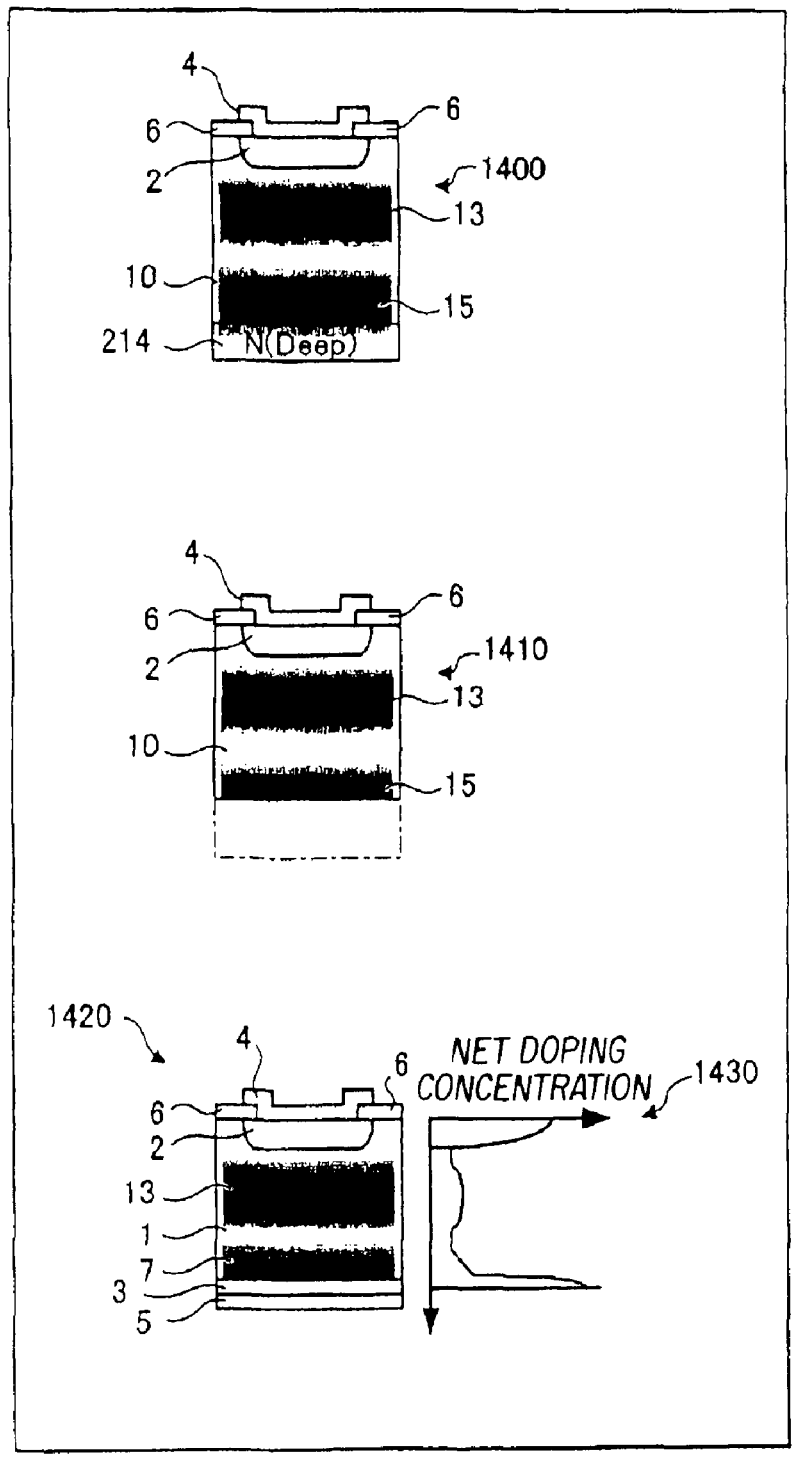
FIG. 14 shows processes to manufacture the semiconductor device of Embodiment 2 of the invention.

Next, processes to manufacture an actual semiconductor device of Embodiment 2 are explained. Here, as one example, a case of manufacture of a semiconductor device (1200 V class breakdown voltage, rated current 150 A) with the dimensions and net doping concentration shown in FIG. 12 is explained. FIG. 13 and FIG. 14 show manufacturing processes. First, as shown in cross-sectional view 1300, cross-sectional view 1310, cross-sectional view 1311, and cross-sectional view 1320 in FIG. 13, similarly to Embodiment 1, standard diode processes are used to form a second semiconductor layer 2, a guard ring edge structure, not shown, an insulating film 6, and an anode 4 on a mirror-finished face of an FZ wafer 10 into which have been introduced phosphorus (P) as well as oxygen to the solid solution limit concentration.

Next, as shown in cross-sectional view 1330 in FIG. 13, the FZ wafer 10 is irradiated with protons from the side of the anode 4, under the same conditions as in Embodiment 1. However, the thickness of the aluminum absorber is adjusted such that the proton range is 50 µm from the interface between the semiconductor of the FZ wafer 10 and the anode 4 (FIG. 12, Rp1 in characteristic diagram 1220). In the cross-sectional view 1330, the x symbols on the side near the second semiconductor layer 2 represent crystal defects 12 occurring within the FZ wafer 10 due to proton irradiation when this range Rp1 is made 50 µm.

Next, the thickness of the aluminum absorber is adjusted such that the proton range is 110 to 140 µm from the interface between the semiconductor of the FZ wafer 10 and the anode 4 (FIG. 12, Rp2 in characteristic diagram 1220), and proton irradiation of the FZ wafer 10 from the side of anode 4 is performed under the same conditions as in Embodiment 1. In cross-sectional view 1330, the x symbols on the side near the second semiconductor layer 2 represent crystal defects 14 occurring in the FZ wafer 10 due to proton irradiation when the range Rp2 is made 110 to 140 µm.

The second proton irradiation may also be performed from the side opposite the anode 4. If the anode 4 is formed on the top face of the FZ wafer 10, then the side opposite the anode 4 is the rear-face side of the wafer. The proton distribution when the second proton irradiation is performed from the rear-face side is indicated by the dashed line in the characteristic diagram 1220 of FIG. 12.

Next, as shown in cross-sectional view 1400 in FIG. 14, heat treatment is performed under the same conditions as in Embodiment 1. By this means, the first high-concentration region 13 is formed through recovery of crystal defects 12 resulting from the first proton irradiation, and the second high-concentration region 15 is formed through recovery of crystal defects 14 resulting from the second proton irradiation. The desired broad buffer structure is formed by the first high-concentration region 13. The fourth semiconductor layer 7 is formed by the second high-concentration region 15.

Next, similarly to Embodiment 1 and as shown in cross-sectional view 1410 in FIG. 14, the thickness of the FZ wafer 10 is made, for example, 120 µm. And similarly to Embodiment 1 and as shown in cross-sectional view 1420 in FIG. 14, the third semiconductor layer 3 and cathode 5 are formed, to complete the semiconductor device (diode). The portion of the FZ wafer 10 between the second semiconductor layer 2 and the fourth semiconductor layer 7 is the first semiconductor layer 1. The characteristic diagram 1430 in FIG. 14 is the profile of the net doping concentration corresponding to the semiconductor device of the cross-sectional view 1420.

Embodiment 3

Figure 15:
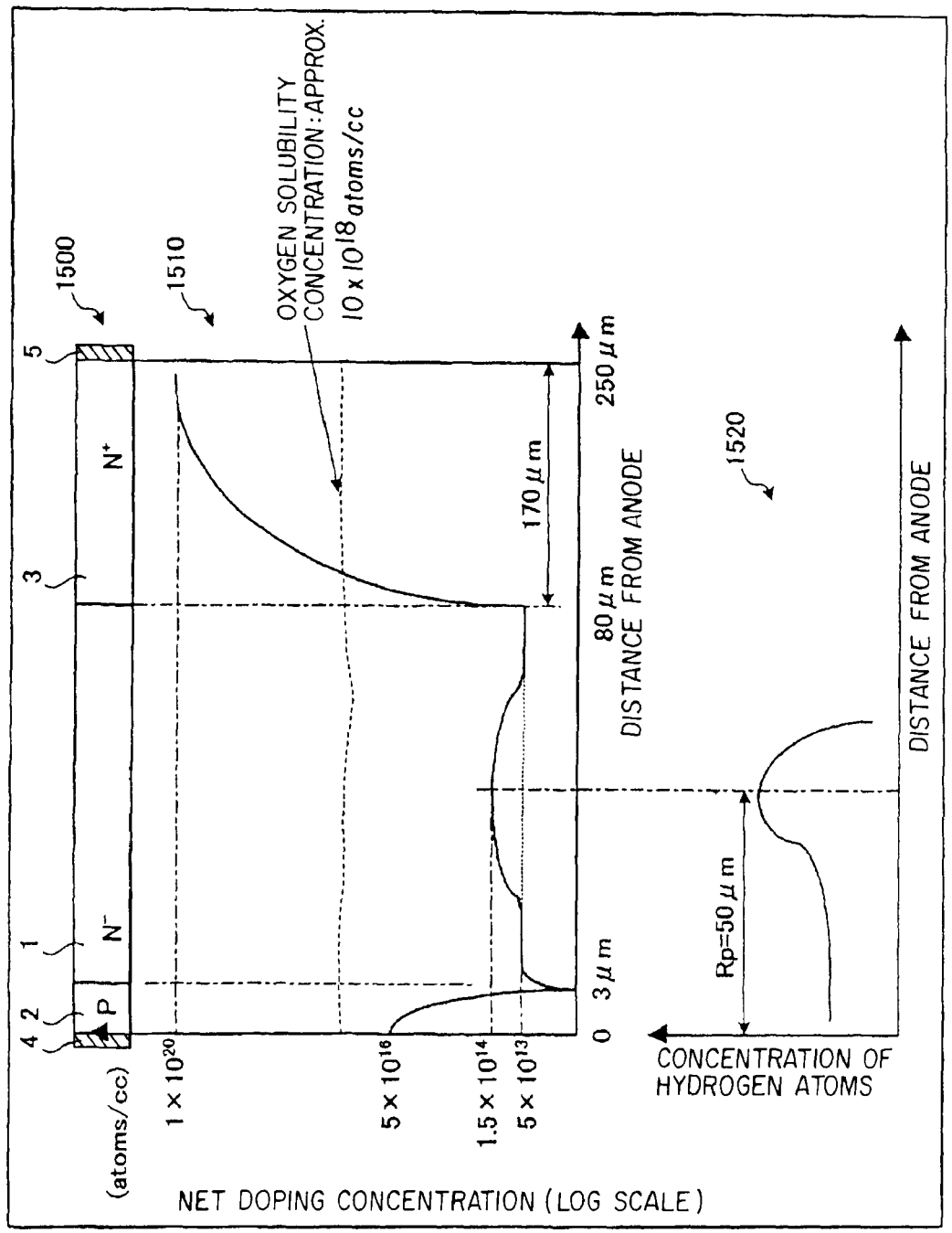
FIG. 15 shows the configuration of the semiconductor device of Embodiment 3 of the invention, the net doping concentration, and the proton distribution.

FIG. 15 shows the configuration of the semiconductor device of Embodiment 3 of the invention, the net doping concentration, and the distribution of hydrogen concentration. As shown in cross-sectional view 1500 of the semiconductor device in FIG. 15, the semiconductor device of Embodiment 3 is the semiconductor device of Embodiment 1 shown in FIG. 1, in which the third semiconductor layer 3 is made thick. Otherwise the configuration is similar to that of Embodiment 1, and so the same symbols are assigned and explanations are omitted.

As an example, the net doping concentrations and dimensions of each of the portions of the semiconductor device of Embodiment 3 are described. However, only values different from those of the example of Embodiment 1 are explained. As indicated in the characteristic diagram 1510 for the distance from the anode and the net doping concentration (log scale) in FIG. 15, the distance to the interface between the first semiconductor layer 1 and the third semiconductor layer 3, and the distance to the interface between the third semiconductor layer 3 and the cathode 5, are respectively 80 μm and 250 μm. Hence the thickness of the third semiconductor layer 3 is 170 μm.

The net doping concentration in the third semiconductor layer 3 at the interface with the cathode 5 is $1\times10^{20}$ atoms/cc. As indicated in the characteristic diagram 1520 of the distance from the anode and the proton distribution in FIG. 15, the distance to the location in the first semiconductor layer 1 at which the net doping concentration peaks is 50 μm, and the proton concentration in this vicinity is high, forming a broad buffer structure.

Figure 16:
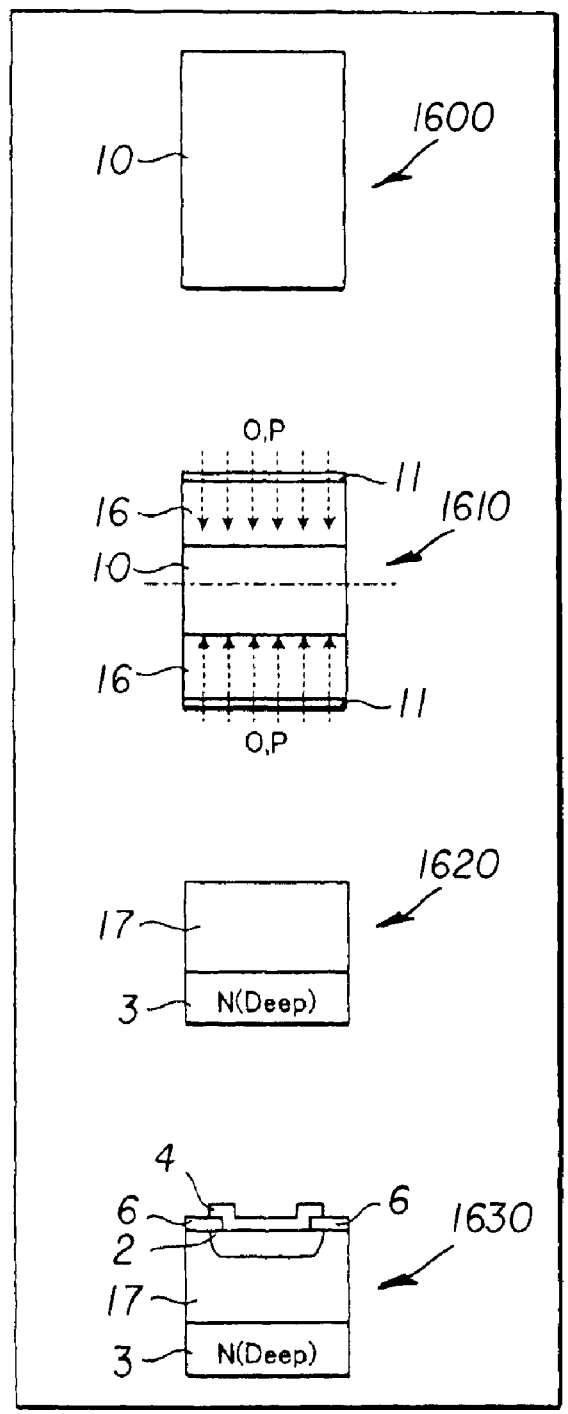
FIG. 16 shows processes to manufacture the semiconductor device of Embodiment 3 of the invention.
Figure 17:
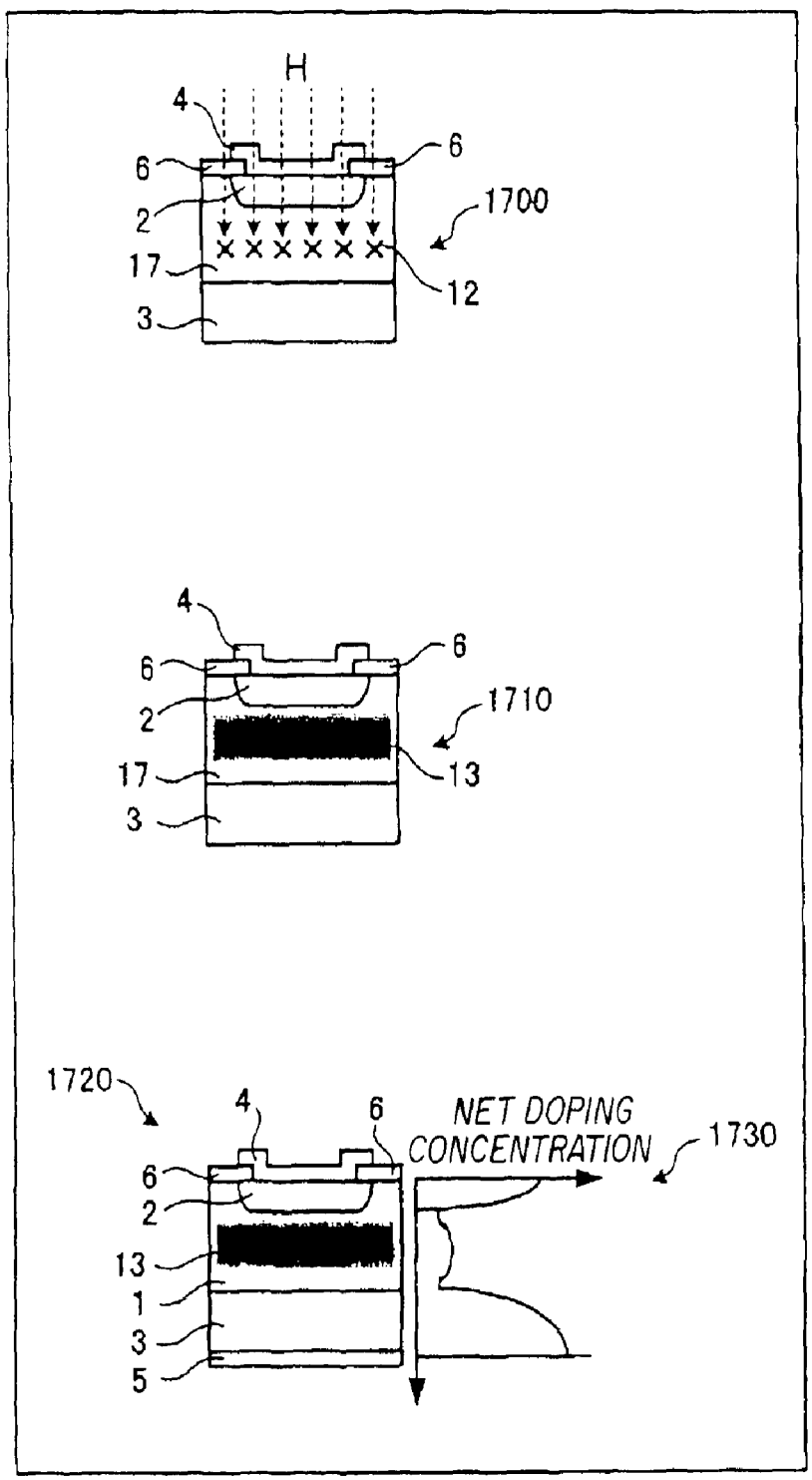
FIG. 17 shows processes to manufacture the semiconductor device of Embodiment 3 of the invention.

Next, processes to manufacture the semiconductor device of Embodiment 3 are explained. As an example, a case is explained in which a semiconductor device (1200 V class breakdown voltage) with the example dimensions and net doping concentrations shown in FIG. 15 is manufactured. FIG. 16 and FIG. 17 show manufacturing processes. First, as shown in cross-sectional view 1600 in FIG. 16, a FZ wafer 10 similar to that of Embodiment 1 is prepared as the semiconductor substrate. However, the thickness of the FZ wafer 10 is 50 μm.

Next, as shown in cross-sectional view 1610 in FIG. 16, phosphorus is diffused from both faces of the FZ wafer 10, similarly to Embodiment 1. However, the heat treatment time is 200 hours, and the phosphorus is diffused to a depth of 170 μm, to form high-concentration phosphorus layers 16 of thickness 170 μm. At this time, a large amount of oxygen is introduced into the wafer from both faces of the FZ wafer 10, and the oxygen concentration in the FZ wafer 10 is the solid solution limit concentration (approximately $1\times10^{18}$ atoms/cc).

Next, as indicated by the dot-dash line in cross-sectional view 1610, the FZ wafer 10 is ground, to remove a high-concentration phosphorus diffusion layer 16 at the wafer surfaces, resulting in a thickness of 250 μm. By this means, as shown in cross-sectional view 1620 in FIG. 16, a thin wafer 17 of thickness 250 μm, having a third semiconductor layer 3 comprising a high-concentration phosphorus layer 16, is obtained. The surface of this thin wafer 17 is ground and polished to a mirror finish. At this stage, of the 250 μm thickness of the thin wafer 17, the thickness of the region with a high resistivity of 90 Ω-cm is 80 μm.

The surface of the thin wafer 17 on the side without the third semiconductor layer 3 is mirror-finished, with a resistivity of 90 Ω-cm. On the other hand, the surface of the thin wafer 17 on the side of the third semiconductor layer 3 remains in the state in which the phosphorus glass has been removed. The surface concentration at this face is for example approximately $1\times10^{20}$ atoms/cm$^3$, and the high-concentration phosphorus is diffused from the surface of the thin wafer 17 on the side of the third semiconductor layer 3 to a depth of for example approximately 170 μm.

Next, as shown in cross-sectional view 1630 in FIG. 16, standard diode processes are used to form a second semiconductor layer 2, a guard ring edge structure, not shown, an insulating film 6, and an anode 4 on the surface of the thin wafer 17 on the side without the third semiconductor layer 3. Then, as shown in cross-sectional view 1700 in FIG. 17, the thin wafer 17 is irradiated with protons from the side of the anode 4 under the same conditions as in Embodiment 1. However, the thickness of the aluminum absorber is adjusted such that the proton range is 50 μm from the interface between the semiconductor of the thin wafer 17 and the anode 4. In cross-sectional view 1700, x symbols represent crystal defects 12 occurring in the thin wafer 17 due to proton irradiation.

Next, as shown in cross-sectional view 1710 in FIG. 17, heat treatment is performed under the same conditions as in Embodiment 1. By this means, the high-concentration region 13 is formed through recovery of the crystal defects 12, to form the desired broad buffer structure. Then, as shown in cross-sectional view 1720 in FIG. 17, a cathode 5 is formed similarly to Embodiment 1, to complete the semiconductor device (diode). The portion in the thin wafer 17 between the second semiconductor layer 2 and third semiconductor layer 3 is the first semiconductor layer 1.

The characteristic diagram 1730 in FIG. 17 is a profile of the net doping concentration corresponding to the semiconductor device of cross-sectional view 1720. Even when phosphorus is diffused and a deep cathode diffusion layer remains, as in this Embodiment 3, through the effect of the broad buffer structure, a diode is obtained capable of soft recovery and with lower losses than in the prior art.

This invention is not limited to diodes, and can be applied to normal IGBTs and to reverse blocking IGBTs. An IGBT or similar to which this invention is applied can achieve low losses and turn-off with oscillation suppressed. In particular, when manufacturing a reverse blocking IGBT, a FZ bulk wafer is used, a gate structure, emitter structure, and edge structure are fabricated on the top face, and after irradiation by an electron beam of 100 kGy or less, the rear surface of the wafer is ground and polished such that the final thickness of the wafer as a whole is approximately 100 μm; there is then a process of boron ion implantation into the face exposed by grinding and laser irradiation to activate the boron.

On the other hand, at the time of turn-off, the depletion layer extends from the top side similarly to diode reverse recovery, and carriers are annihilated; but similarly to the case of a diode, rapid annihilation of carriers can be suppressed, so that smooth turn-off with no oscillation is possible. Hence diodes having low losses and soft recovery, and IGBTs capable of smooth turn-off without oscillation, can be manufactured. In PWM inverters and other power conversion devices using IGBT modules with such characteristics, overvoltage failure and EMI noise occurrence can also be prevented.

Figure 18:
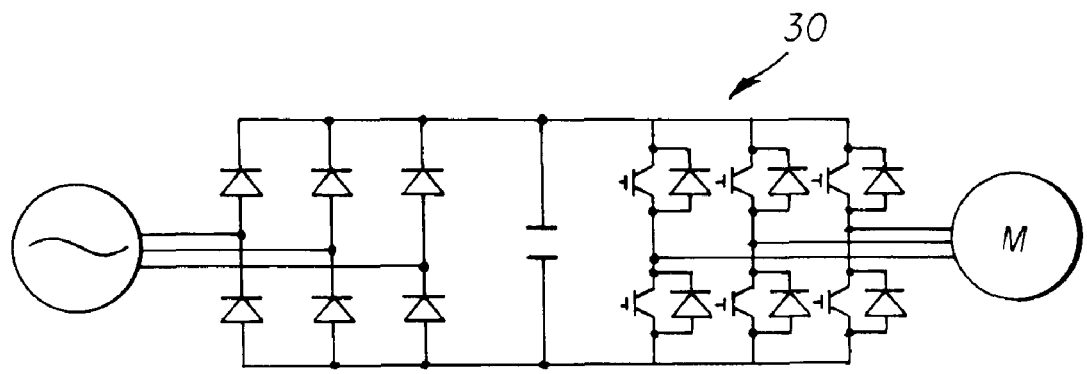
FIG. 18 shows the configuration of a converter/inverter circuit.
Figure 19:
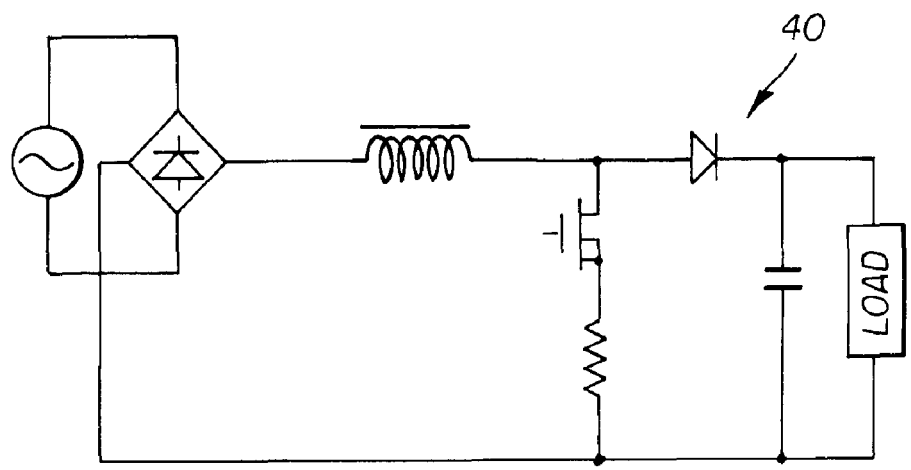
FIG. 19 shows the configuration of a power factor correction circuit.
Figure 20:
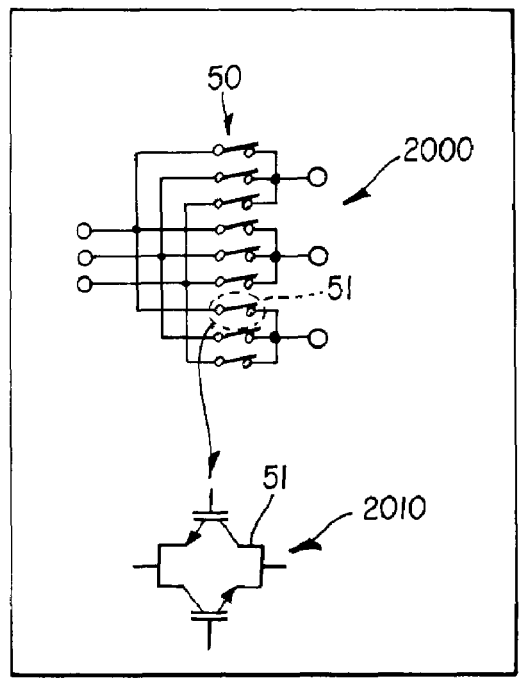
FIG. 20 shows the configuration of a matrix converter circuit.

FIG. 18, FIG. 19, and FIG. 20 show examples of applications of diodes and FS-IGBTs of Embodiments 1 through 3. The converter/inverter circuit 30 shown in FIG. 18 is capable of efficient control of induction motors, servomotors and similar, and is widely used in industry, electrical rail systems, and other areas. The power factor correction circuit (PFC circuit) 40 shown in FIG. 19 is a circuit which executes control to adjust the AC-DC conversion input current to a sinusoidal shape and improve the power factor, and is used in switching power supplies. The circuit diagram 2000 in FIG. 20 is an overall diagram of a matrix converter circuit 50, and the circuit diagram 2010 shows the configuration of the switching portion 51 of the matrix converter circuit 50.

According to each of the above Embodiments 1 through 3, by means of a broad buffer structure, there is the advantageous result that reverse recovery losses can be decreased with greatest efficiency and soft recovery characteristics can be obtained. Further, a FZ wafer is used and moreover there is no epitaxial growth process, so that there is the advantageous result that manufacture is considerably less expensive than in the prior art. Further, in Embodiment 1 and 2, prior to grinding the wafer to make the wafer thin, proton irradiation and heat treatment to form the broad buffer structure are performed, so that cracking of the wafer during these processes can be prevented.

In Embodiment 3, proton irradiation and heat treatment are performed after making the wafer thin, but the thin wafer is not so thin that breakage may occur during these processes, and so breakage of the wafer during these processes can be prevented. Hence manufacturing with high yields is possible. Further, after making the wafer thin, the third semiconductor layer 3 is formed to be transparent, so that reverse recovery losses can be further reduced.

A method is widely known in which, by irradiating a SOI (silicon-on-insulator) substrate with protons or helium and performing heat treatment, defects induced by proton or helium irradiation cause oxygen to diffuse outward, residual oxygen in the SOI substrate is removed, and the donor concentration is reduced (see for example Japanese Patent Laid-open No. 63-27083). This method and a method of this invention are completely different with respect to both general concept and results.

That is, in the present invention oxygen is not removed but is caused to remain in the silicon, so that the object and method are inherently different from the method disclosed in Japanese Patent Laid-open No. 63-27083. Further, in this invention complex defects are formed from oxygen and hydrogen (protons) and are caused to be donors, so that the action is different from the method disclosed in Japanese Patent Laid-open No. 63-27083. Further, in the present invention the net doping concentration (in this case, the donor concentration) is increased, so that the result is completely different from the method disclosed in Japanese Patent Laid-open No. 63-27083.

Further, according to the method disclosed in Japanese Patent Laid-open No. 63-27083, the MOS threshold value can be stabilized. On the other hand, in this invention no MOS structure exists in the case of a diode. And, even when this invention is applied to a MOS device, the action and result of this invention relate to the N⁻ drift layer, and have no effect on the MOS structure formed in the silicon surface, and so in this respect also the present invention differs from the method disclosed in Japanese Patent Laid-open No. 63-27083.

Embodiment 4

Figure 21:
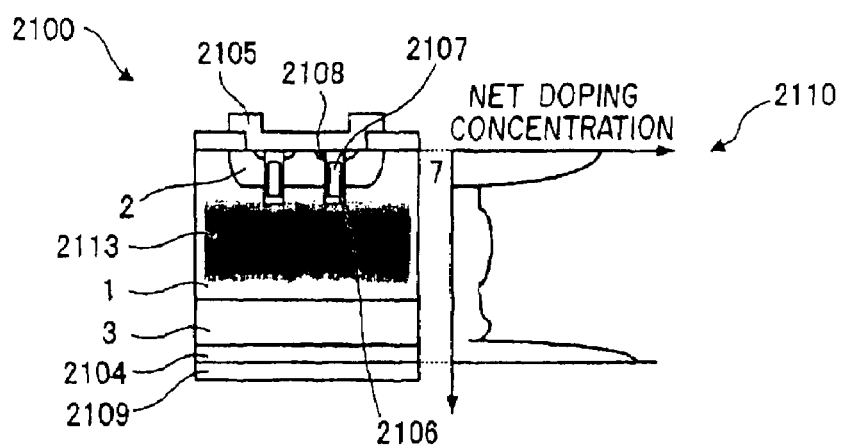
FIG. 21 shows the configuration of the semiconductor device of Embodiment 4 and the net doping concentration.

FIG. 21 shows the configuration of the semiconductor device of Embodiment 4 and the net doping concentration. As shown in the cross-sectional view 2100 of the semiconductor device in FIG. 21, this semiconductor device is a FS (Field Stop) type IGBT. The P-type second semiconductor layer 2 serving as the P base layer is formed on the side of one main face of the N-type first semiconductor layer 1, serving as the N⁻ drift layer. The third semiconductor layer 3 serving as the N-type field stop layer, with higher impurity concentration than the first semiconductor layer 1, is formed on the side of the other main face of the first semiconductor layer 1. The P collector layer 2104 is formed on the surface of the third semiconductor layer 3.

The emitter 2105 is formed on the surface of the second semiconductor layer 2. Also, a MOS gate structure, comprising a gate insulating film 2106 and gate electrode 2107, is formed so as to be in contact with the first semiconductor layer 1 and second semiconductor layer 2. And, an N⁺ source region 2108 is formed in a portion of the second semiconductor layer 2 in contact with the emitter electrode 2105 and gate insulating film 2106. The collector electrode 2109 is formed on the surface of the P collector layer 2104.

As shown in the characteristic diagram 2110 for the distance from the emitter electrode 2105 and the net doping concentration (log scale) in FIG. 21, the net doping concentration in the first semiconductor layer 1 has a peak in the high-concentration region 2113 substantially in the center of the first semiconductor layer 1, which decreases with a certain slop toward the second semiconductor layer 2 and third semiconductor layer 3. That is, the semiconductor device of Embodiment 4 has a broad buffer structure. This broad buffer structure is formed by the high-concentration region 2113. The net doping concentrations in the second semiconductor layer 2, third semiconductor layer 3, and P collector layer 2104 are all higher than the net doping concentration in the first semiconductor layer 1.

An example of the net doping concentrations and dimensions for each of the portions when fabricating the semiconductor device of Embodiment 4, with a chip size of 10 mm×10 mm, such that the breakdown voltage is in the 1200 V class and the rated current is 150 A. Dimensions take as reference the interface between the second semiconductor layer 2 and the emitter electrode 2105, and unless stated otherwise, refer to distances from this interface.

The distance to the interface between the second semiconductor layer 2 and first semiconductor layer 1 is 3 µm. The distance to the interface between the P collector layer 2104 and the collector electrode 2109 is 140 µm. The distance from the interface between the third semiconductor layer 3 and the P collector layer 2104 to the interface between the P collector layer 2104 and the collector electrode 2109, that is, the thickness of the P collector layer 2104, is 0.5 µm.

The net doping concentration in the second semiconductor layer 2 is $5\times10^{16}$ atoms/cc at the interface with the emitter electrode 2105, decreases toward the first semiconductor layer 1, and at the interface with the first semiconductor layer 1 is lower than $5\times10^{13}$ atoms/cc. The net doping concentration in the first semiconductor layer 1 is lower than $5\times10^{13}$ atoms/cc at the interface with the second semiconductor layer 2, but becomes $5\times10^{13}$ atoms/cc in the vicinity of the interface with the second semiconductor layer 2.

The net doping concentration at the location of the peak substantially in the center of the first semiconductor layer 1 is $1.5\times10^{14}$ atoms/cc. The net doping concentration in the first semiconductor layer 1 at and near the interface with the third semiconductor layer 3 is $5\times10^{13}$ atoms/cc.

The net doping concentration in the third semiconductor layer 3 is $5\times10^{13}$ atoms/cc at the interface with the first semiconductor layer 1, and rises toward the P collector layer 2104. The net doping concentration in the third semiconductor layer 3 near the interface with the P collector layer 2104 is higher than the peak net doping concentration in the first semiconductor layer 1, which is $1.5\times10^{14}$ atoms/cc, but at the interface with the P collector layer 2104 is lower than $5\times10^{13}$ atoms/cc.

The net doping concentration in the P collector layer 2104 at the interface with the third semiconductor layer 3 is lower than $5\times10^{13}$ atoms/cc, but rises toward the collector electrode 2109, and at the interface with the collector electrode 2109 is $1\times10^{18}$ atoms/cc.

The distance to the location of the net doping concentration peak in the first semiconductor layer 1 is 60 µm. This distance is equal to the proton range Rp when in the manufacturing stage the surface of the second semiconductor layer 2 is irradiated with protons. The proton concentration is high in the vicinity of this proton range Rp. Oxygen atoms are introduced into the first semiconductor layer 1, and the desired broad buffer structure is formed by complex donors comprising oxygen atoms and protons.

Embodiment 5

Figure 22:
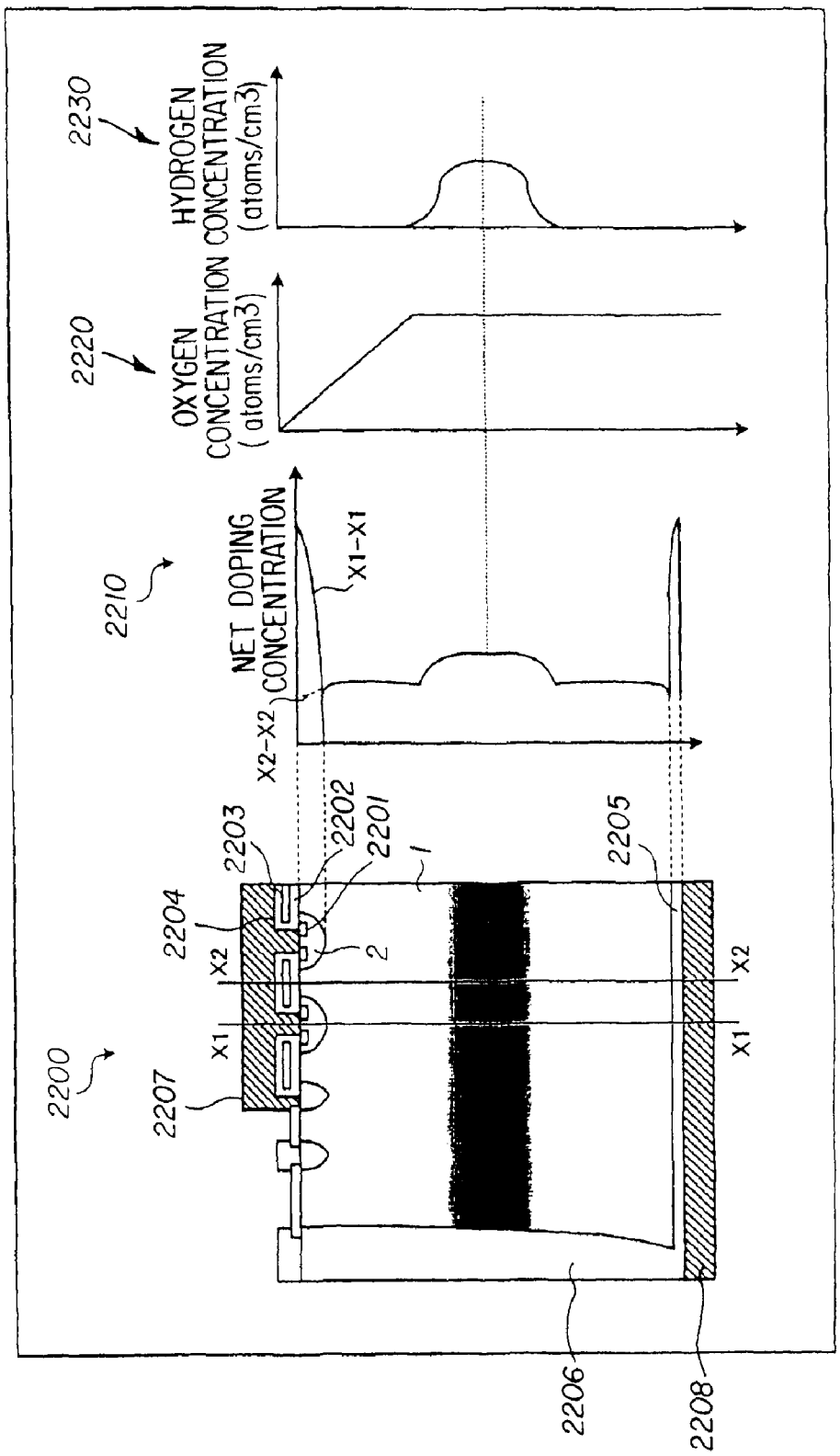
FIG. 22 shows the configuration of the semiconductor device of Embodiment 5, the net doping concentration, the oxygen concentration, and the hydrogen concentration.

FIG. 22 shows the configuration of the semiconductor device of Embodiment 5, the net doping concentration, the oxygen concentration, and the hydrogen concentration. As shown in the cross-sectional view 2200 of the semiconductor device in FIG. 22, this semiconductor device is a reverse blocking IGBT, which is an NPT (Non-Punch Through) type IGBT with reverse blocking ability added.

In FIG. 22, the symbol 1 indicates the N-type first semiconductor layer which serves as an N⁻ drift layer. The symbol 2 indicates the P-type second semiconductor layer 2 which serves as a P well region. Symbol 2201 is an N-type emitter region, symbol 2202 is a gate insulating film, symbol 2203 is a gate electrode, symbol 2204 is an interlayer insulating film, symbol 2205 is a P collector layer, symbol 2206 is a side-face P collector layer, symbol 2207 is an emitter electrode, and symbol 2208 is a collector electrode.

Because diode operation occurs in the reverse blocking IGBT, by providing an N-type broad buffer layer, not only the IGBT operation, but the diode operation is also improved. This broad buffer layer may or may not reach the side face P collector layer 2206. In FIG. 22, symbol 2210 indicates a characteristic diagram of the distance from the emitter electrode 2207 and the net doping concentration (log scale), symbol 2220 denotes a characteristic diagram of the distance from the emitter electrode 2207 and the oxygen distribution, and symbol 2230 denotes a characteristic diagram of the distance from the emitter electrode 2207 and the hydrogen distribution.

In the case of a reverse blocking IGBT, the thickness from the top face to the rear face of the silicon substrate is not specified in particular, but for a breakdown voltage of 600 V for example the thickness may be 100 μm, and for a breakdown voltage of 1200 V the thickness may be approximately 180 μm. As indicates in the characteristic diagram 2220 for the distance from the emitter electrode 2207 and the oxygen distribution, in the reverse blocking IGBT the oxygen concentration is low on the side of the top face of the substrate, that is, in the region on the emitter electrode side of the first semiconductor layer 1.

As indicated in the characteristic diagram 2230 for the distance from the emitter electrode 2207 and the hydrogen distribution, proton irradiation is performed such that the range is halfway on the side of the rear face in the substrate, that is, so that protons enter the region of high oxygen concentration. For example, the proton range is approximately 25 μm from the rear face (75 μm from the top face) for a breakdown voltage of 600 V, and is 50 μm from the rear face (130 μm from the top face) for a breakdown voltage of 1200 V. By this means, oscillation during diode operation in particular can be suppressed, and radiation noise can be reduced.

Embodiment 6

Figure 23:
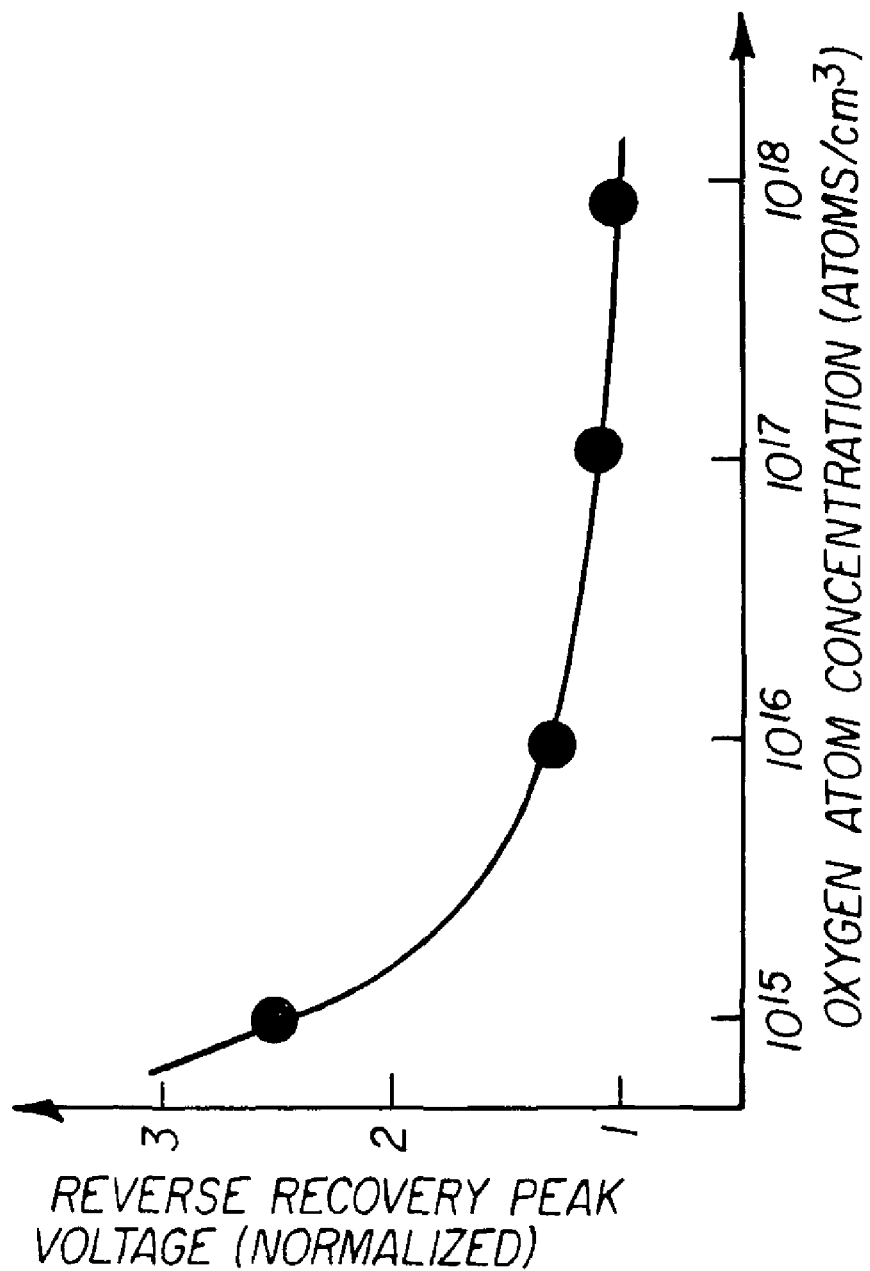
FIG. 23 shows the relation between the oxygen atom concentration in the silicon substrate and the diode reverse recovery peak voltage of the semiconductor device of Embodiment 6.

FIG. 23 shows the relation between the oxygen atom concentration in the silicon substrate and the diode reverse recovery peak voltage (surge voltage during reverse recovery) of the semiconductor device of Embodiment 6. In FIG. 23, the vertical axis indicates normalized values. The semiconductor device of this Embodiment 6 is a broad buffer diode, manufactured by a method described above.

As shown in FIG. 23, the concentration and mobility values in the broad buffer layer after proton irradiation and heat treatment differ, and the diode reverse recovery characteristic changes, depending on the oxygen concentration in the substrate. If the oxygen concentration is $1 \times 10^{16}$ atoms/cm3 or higher, the broad buffer layer is formed without problem, and the surge voltage during reverse recovery can be suppressed.

On the other hand, if the oxygen concentration is less than $1 \times 10^{16}$ atoms/cm3, not only is the donor concentration low in the broad buffer layer, but the defect concentration is higher, so that the diode reverse recovery characteristic is the same as in the prior art, and increases in oscillation and surge voltage are observed. Hence it is desirable that the oxygen concentration in the silicon substrate be $1 \times 10^{16}$ atoms/cm3 or higher.

On the other hand, the solid solubility of oxygen when the temperature during diffusion is 1300° C. is $1 \times 10^{18}$/cm³ ("Science of Silicon" (*Shirikon no Kagaku*), Realize Science & Engineering Center Co., Ltd., June 1996). Hence the maximum concentration of oxygen in the silicon substrate is $1 \times 10^{18}$/cm³. From the above, it is desirable that the concentration of oxygen in the silicon substrate by $1 \times 10^{16}$ atoms/cm3 or higher and $1 \times 10^{18}$ atoms/cm3 or lower.

Embodiment 7

FIG. 24 through FIG. 29 show the results of carrier concentration distribution measurements, performed by CV measurement, for semiconductor devices of Embodiment 7. Here, a wafer of thickness 500 μm (and of arbitrary size, such as for example 5 or 6 inches in diameter), obtained by diffusing phosphorus at $1 \times 10^{20}$/cm³ to a depth of 80 μm from the rear face of a 330 Ω-cm FZ-N type silicon wafer (the top face of which is mirror-finished), is used.

During this phosphorus diffusion, oxygen atoms are introduced into the wafer. Below, a wafer containing oxygen is called a DW wafer. A DW wafer is a wafer into which oxygen has been diffused together with phosphorus or other impurities. Here, from the above Embodiment 6, the concentration of oxygen in the wafer is $1 \times 10^{16}$ atoms/cm3 or higher and $1 \times 10^{18}$ atoms/cm3 or lower.

This wafer is irradiated from the top face with protons, H⁺, at a dose of $1.0 \times 10^{11}$ to $1.0 \times 10^{14}$/cm² and an accelerating voltage of 7.9 MeV. In addition, heat treatment is performed for 60 minutes at each temperature from 300° C. to 500° C. in 50° C. increments.

In CV measurements, a CV measurement SSM495 hard probe by Solid State Measurement is used. The device for measurement is fabricated as follows. On the above-described wafer, an initial oxide film is grown to a thickness of 8000 Å, the surface active portion (portion in contact with the anode) is etched, and boron is ion-implanted thereinto at a dose of $1 \times 10^{13}$/cm² and an accelerating voltage of 100 keV.

Then, heat treatment at 1150° C. for 200 minutes is performed, and a P anode layer and guard ring P layer with an edge structure portion are formed. Then, a PSG film is grown to 1.5 μm, the active portion is etched, and after depositing Al—Si 1% by sputtering, patterning is performed to form the anode.

Thereafter, proton irradiation is performed at an accelerating voltage of 7.9 MeV and dose of $1 \times 10^{11}$ to $1 \times 10^{14}$/cm² from the top face, with a range Rp of 40 μm. Heat treatment is then performed in a nitrogen or hydrogen atmosphere under different conditions from 300° C. to 500° C. (in 50° C. increments). Then, Ti/Ni/Au is vacuum-deposited to a thickness of approximately 1 μm on the rear surface, to finally obtain a PiN diode. The active area of this diode (the area of the portion in contact with the surface aluminum electrode and P anode layer) is 0.72 cm².

By thus employing an edge structure for the guard ring and using a high-resistivity wafer, when performing CV measurements the capacitance can be measured over the extent of the depletion layer, approximately 150 μm, at the maximum applied voltage of 250 V of the device, without being affected by the depletion layer edge. Thus, although depending on the extent of donor conversion, depletion occurs to the proton range Rp, that is, to a position 40 µm from the top surface, and so carrier concentrations near this position can be measured.

The carrier concentration N(W) at the depletion layer edge W is given by equation (1) below, and the net donor concentration distribution in the vicinity of Rp is obtained. However, in equation (1) the applied voltage is V, capacitance is C, the permittivity of vacuum is ∈0, the relative permittivity of silicon is ∈s, and the active area of the device is A.

$$\begin{cases} N(W) = -(2/q\varepsilon_0\varepsilon_s A^2)/[d(1/C^2)/dV] \\ W = \varepsilon_0\varepsilon_s A/C \end{cases} \quad \text{Formula 1}$$

Figure 24:
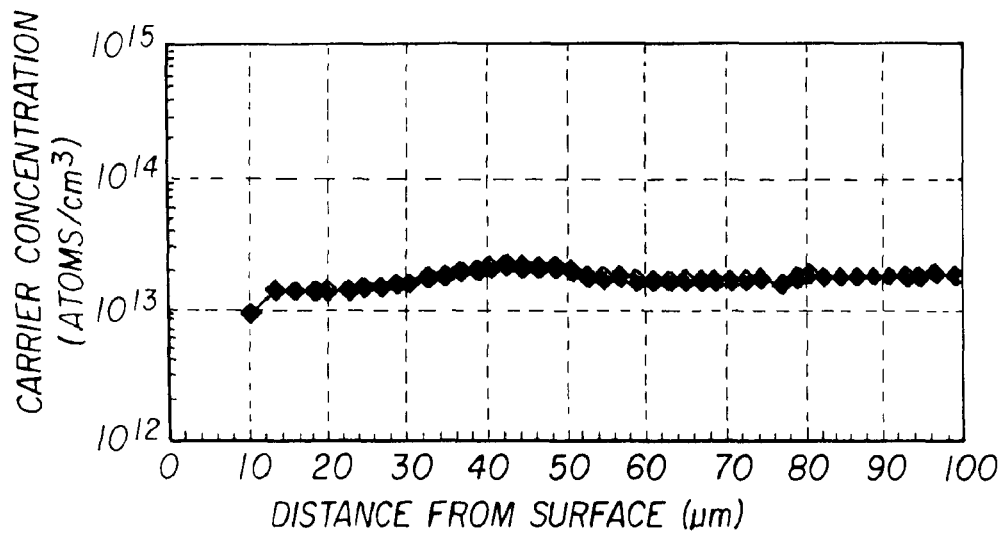
FIG. 24 shows the results of carrier concentration distribution measurements by CV measurement for the semiconductor device of Embodiment 7.
Figure 25:
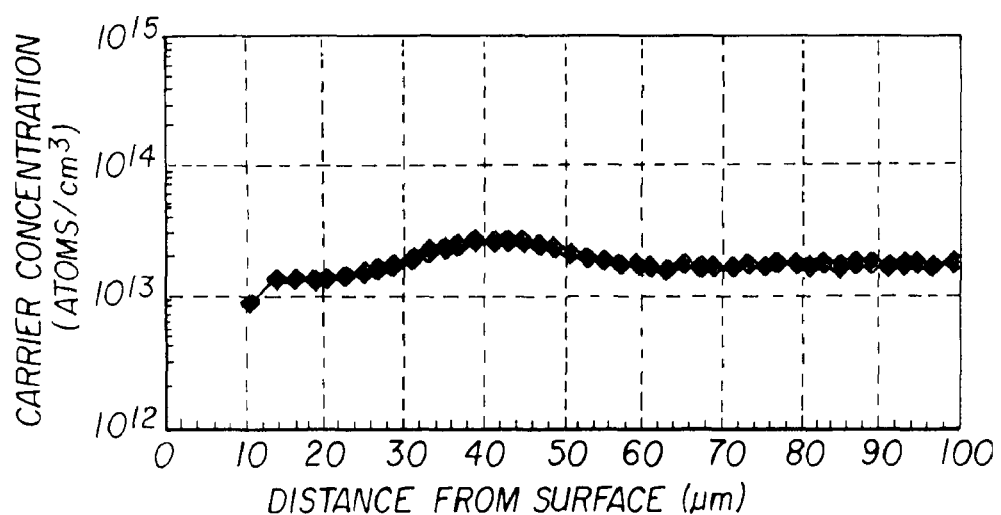
FIG. 25 shows the results of carrier concentration distribution measurements by CV measurement for the semiconductor device of Embodiment 7.
Figure 26:
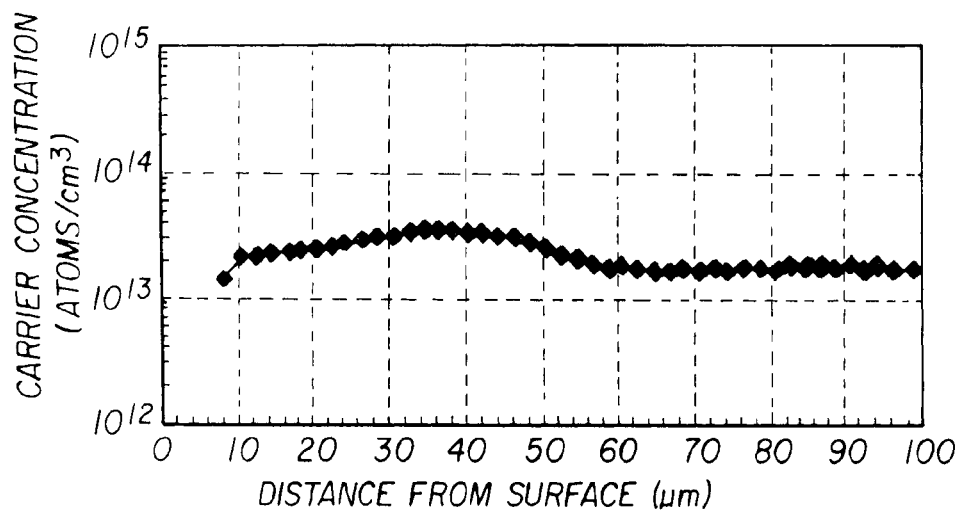
FIG. 26 shows the results of carrier concentration distribution measurements by CV measurement for the semiconductor device of Embodiment 7.
Figure 27:
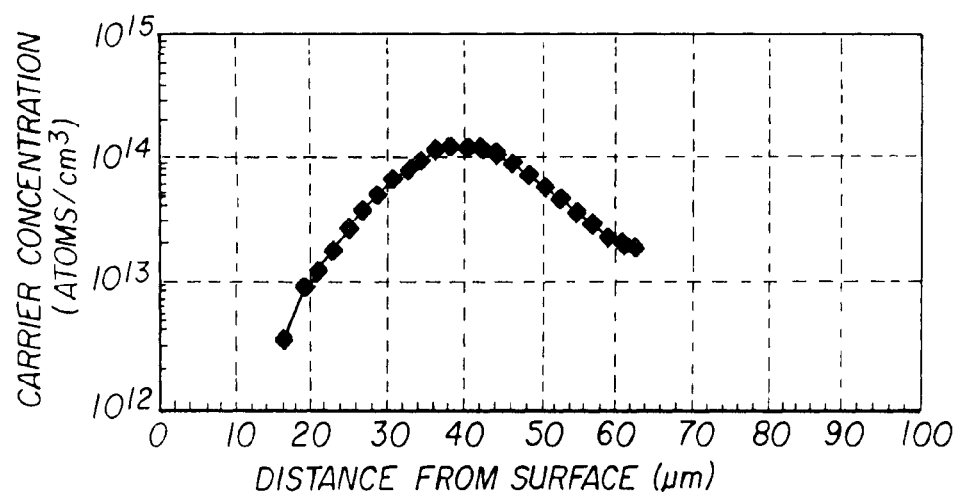
FIG. 27 shows the results of carrier concentration distribution measurements by CV measurement for the semiconductor device of Embodiment 7.
Figure 28:
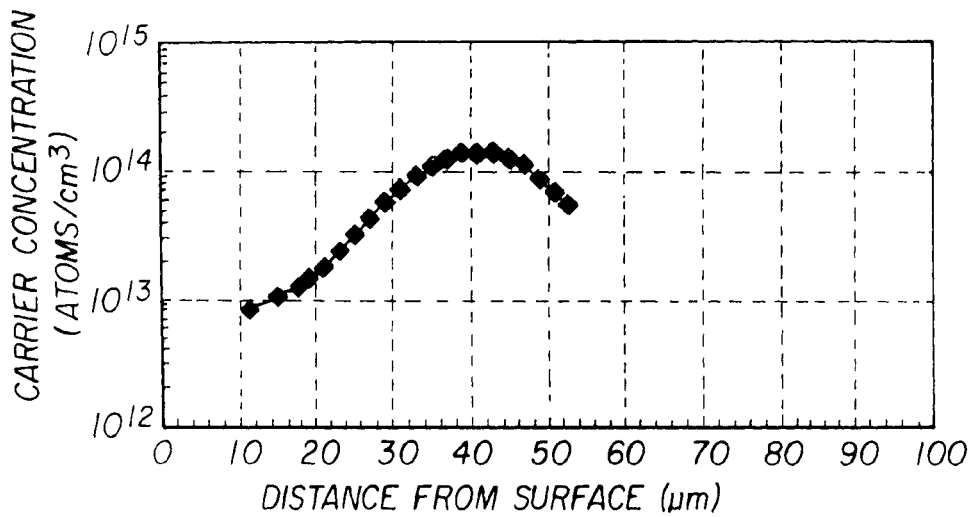
FIG. 28 shows the results of carrier concentration distribution measurements by CV measurement for the semiconductor device of Embodiment 7.
Figure 29:
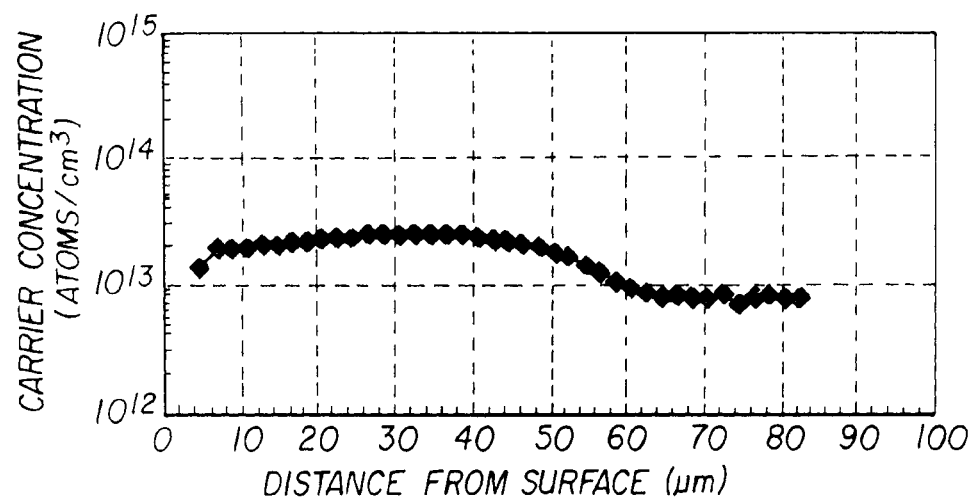
FIG. 29 shows the results of carrier concentration distribution measurements by CV measurement for the semiconductor device of Embodiment 7.

FIG. 24, FIG. 25 and FIG. 26 show CV measurement results for samples with a proton dose of $1.0\times10^{11}/cm^2$, for heat treatment temperatures of 300° C., 350° C., and 400° C., respectively. And, FIG. 27, FIG. 28 and FIG. 29 show CV measurement results for samples with a proton dose of $1.0\times10^{12}/cm^2$, for heat treatment temperatures of 300° C., 350° C., and 400° C., respectively.

FIG. 30 through FIG. 35 show the results of CV measurements for measurement devices fabricated using, instead of a DW wafer, an ordinary FZ wafer without phosphorus diffusion at the wafer rear surface. The method of fabrication of the device for measurement is similar to the above-described cases using DW wafers. Differences from cases in which DW wafers are used are that oversaturated oxygen introduced during phosphorus diffusion does not exist in the wafer (or, exists at or below the detection limit of $1\times10^{15}/cm^3$), and that there is no thermal hysteresis due to diffusion.

Figure 30:
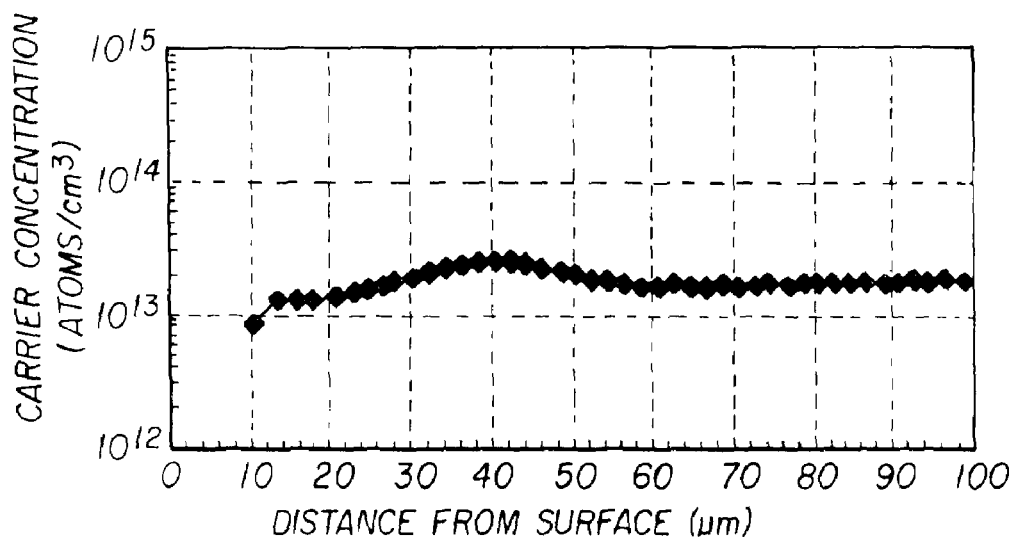
FIG. 30 shows the results of carrier concentration distribution measurements by CV measurement for a semiconductor device for comparison in Embodiment 7.
Figure 31:
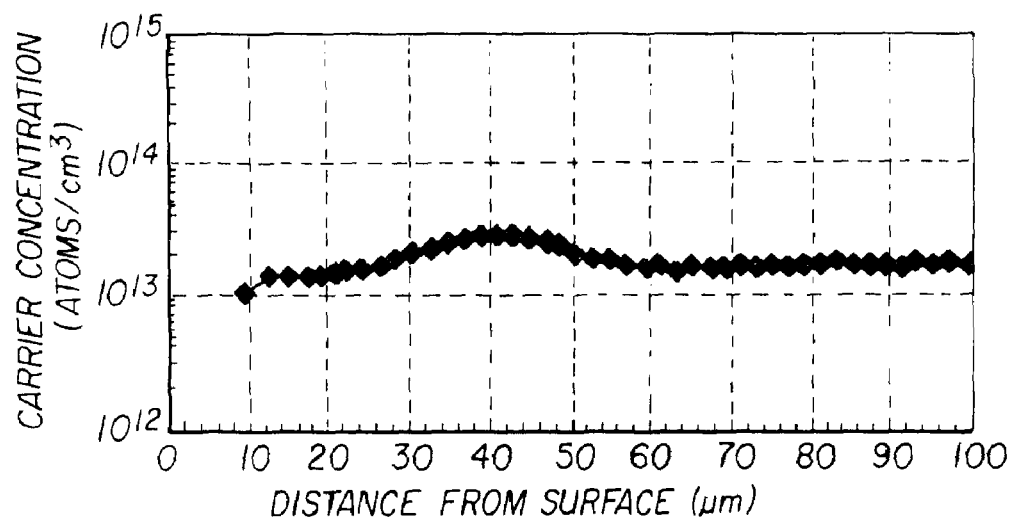
FIG. 31 shows the results of carrier concentration distribution measurements by CV measurement for a semiconductor device for comparison in Embodiment 7.
Figure 32:
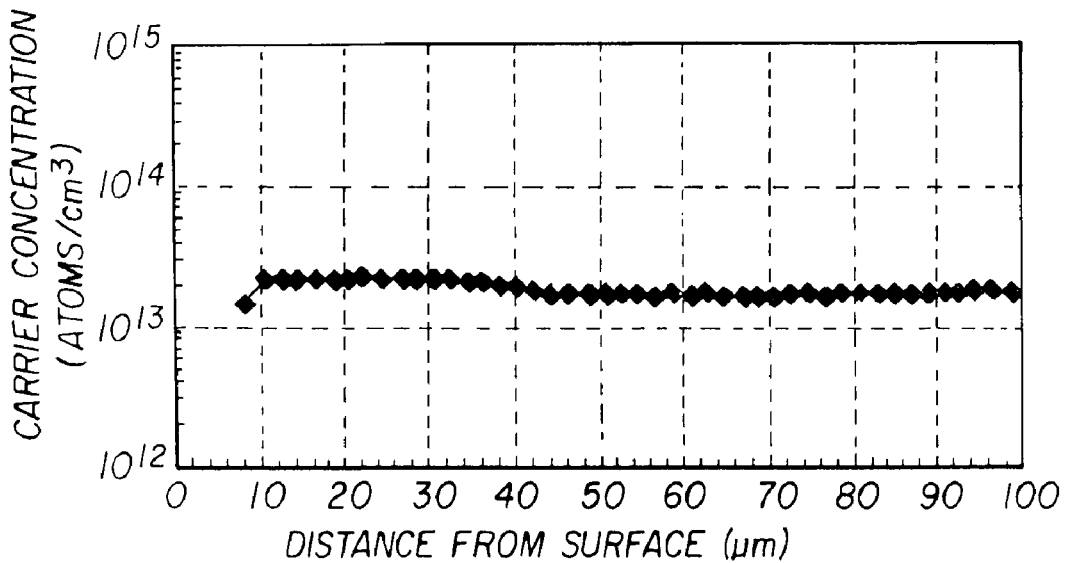
FIG. 32 shows the results of carrier concentration distribution measurements by CV measurement for a semiconductor device for comparison in Embodiment 7.
Figure 33:
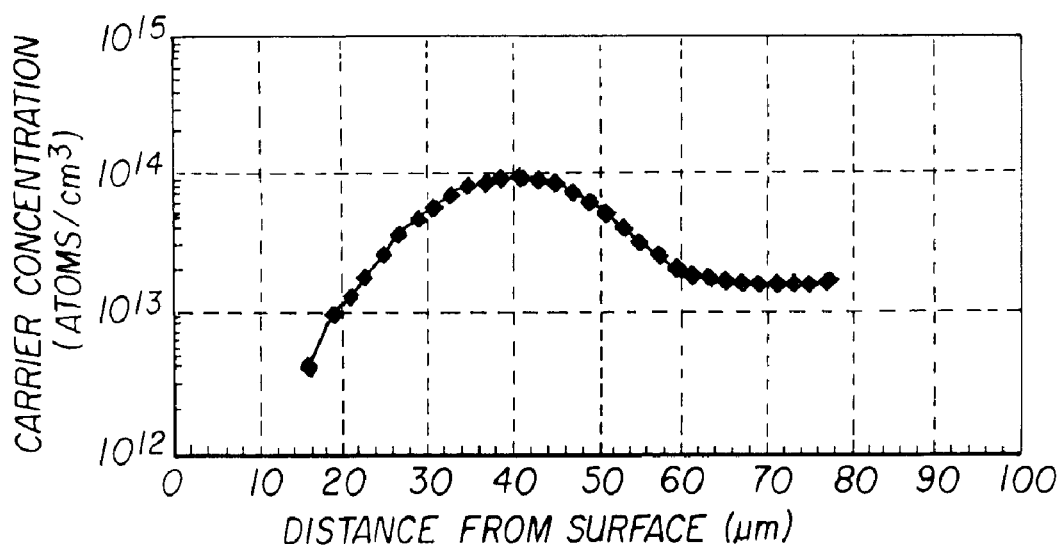
FIG. 33 shows the results of carrier concentration distribution measurements by CV measurement for a semiconductor device for comparison in Embodiment 7.
Figure 34:
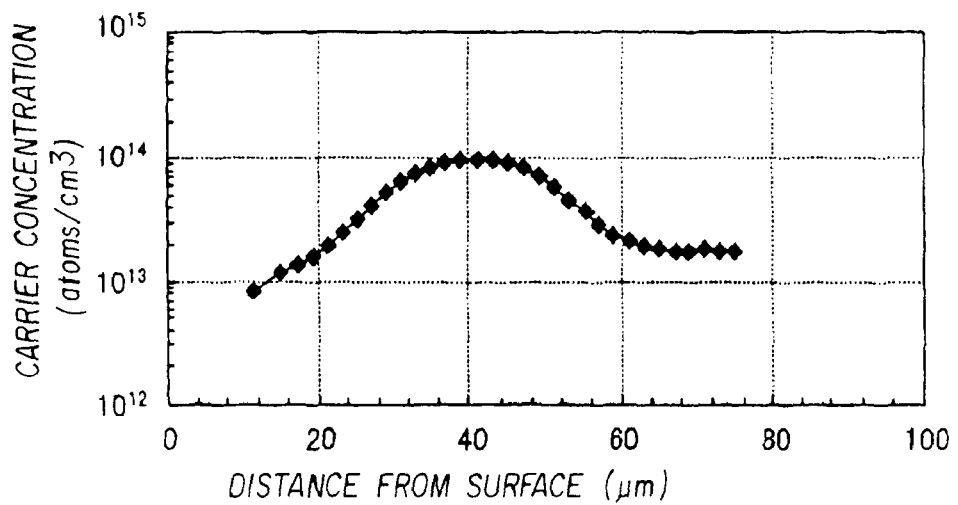
FIG. 34 shows the results of carrier concentration distribution measurements by CV measurement for a semiconductor device for comparison in Embodiment 7.
Figure 35:
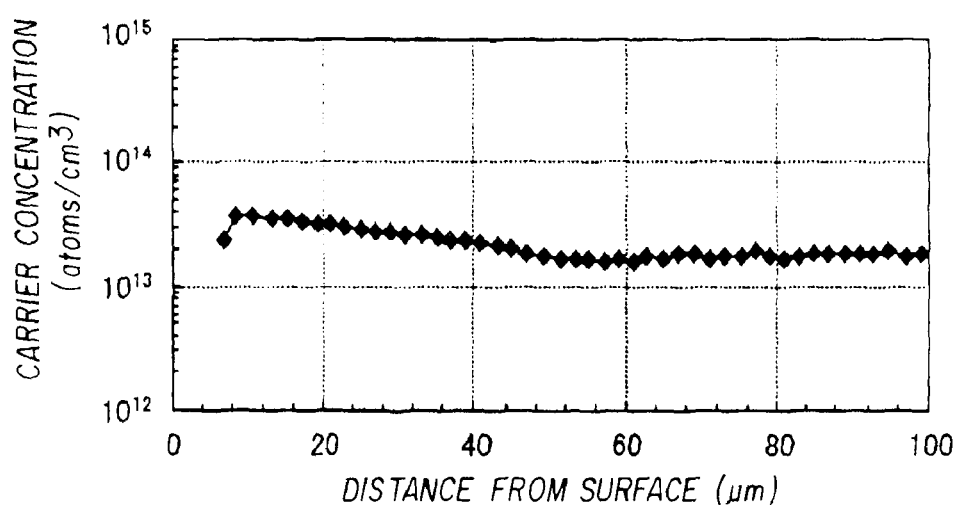
FIG. 35 shows the results of carrier concentration distribution measurements by CV measurement for a semiconductor device for comparison in Embodiment 7.

FIG. 30, FIG. 31 and FIG. 32 show CV measurement results for samples with a proton dose of $1.0\times10^{11}/cm^2$, for heat treatment temperatures of 300° C., 350° C., and 400° C., respectively. And, FIG. 33, FIG. 34 and FIG. 35 show CV measurement results for samples with a proton dose of $1.0\times10^{12}/cm^2$, for heat treatment temperatures of 300° C., 350° C., and 400° C., respectively.

FIG. 36 through FIG. 41 show the results of cross-sectional SR distribution measurements for semiconductor devices of Embodiment 7. Here, a DW wafer formed by a method similar to that for the above-described CV measurements is used, and a method similar to that for CV measurements is used to fabricate the devices for measurement. An SR measurement device SSM2000 by Solid State Measurement is used in SR distribution measurements.

The sample mounting (polishing) angle is 5°44', and 1/20 µm diamond compound is used for final finishing of the polished face. A difference with the samples used in FIG. 24 through FIG. 29 is the fact that the resistivity of the silicon crystal is 120 Ω-cm ($3.83\times10^3/cm^3$); in other respects the samples were the same.

Figure 36:
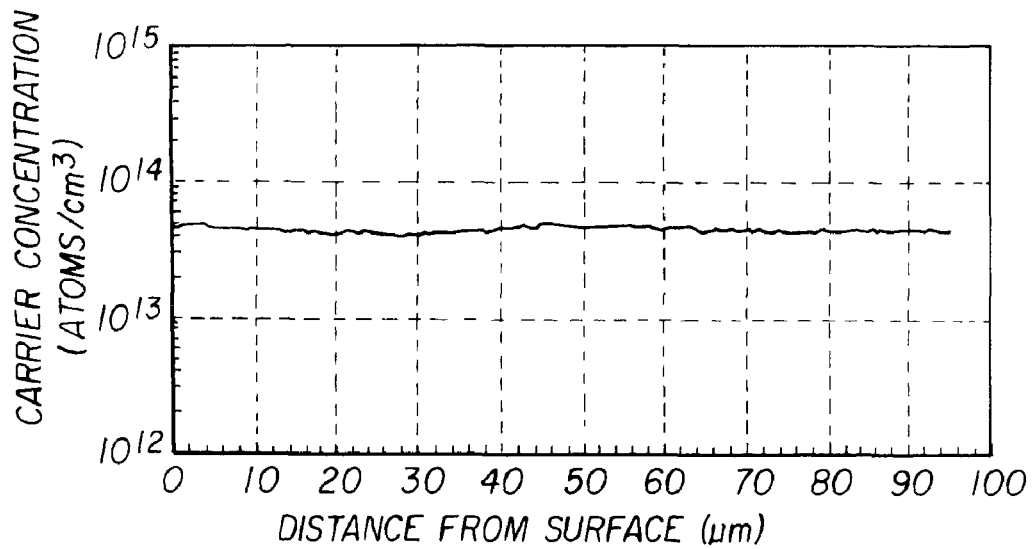
FIG. 36 shows the results of cross-sectional SR distribution measurements for the semiconductor device of Embodiment 7.
Figure 37:
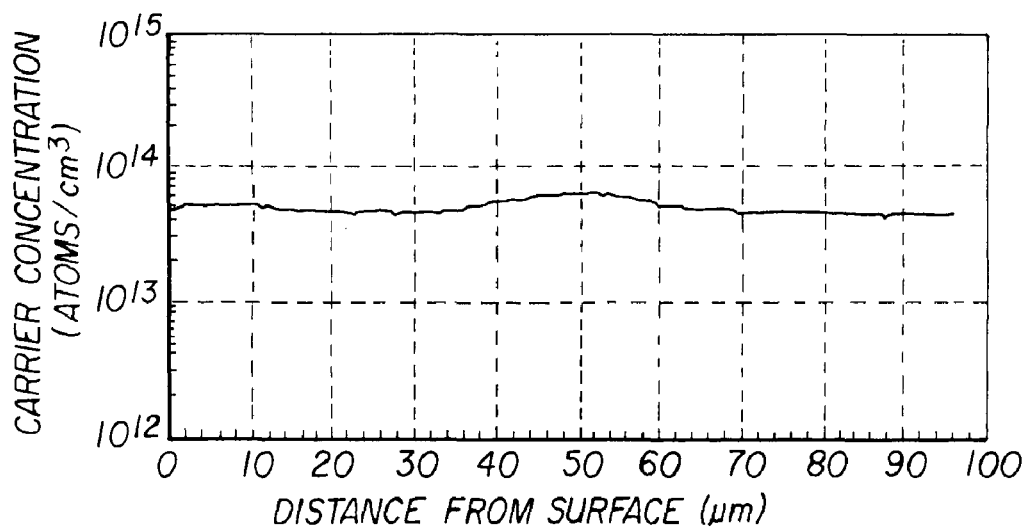
FIG. 37 shows the results of cross-sectional SR distribution measurements for the semiconductor device of Embodiment 7.
Figure 38:
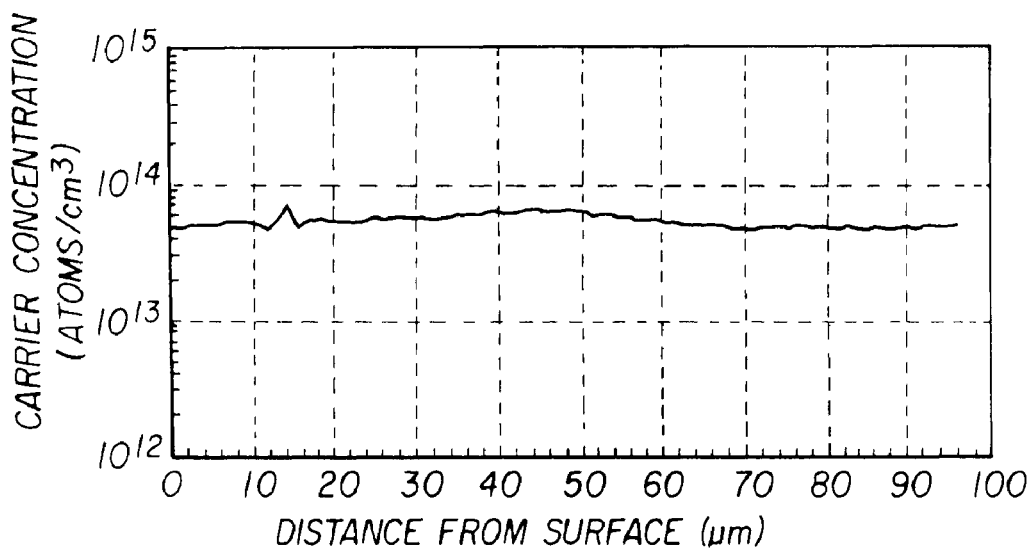
FIG. 38 shows the results of cross-sectional SR distribution measurements for the semiconductor device of Embodiment 7.
Figure 39:
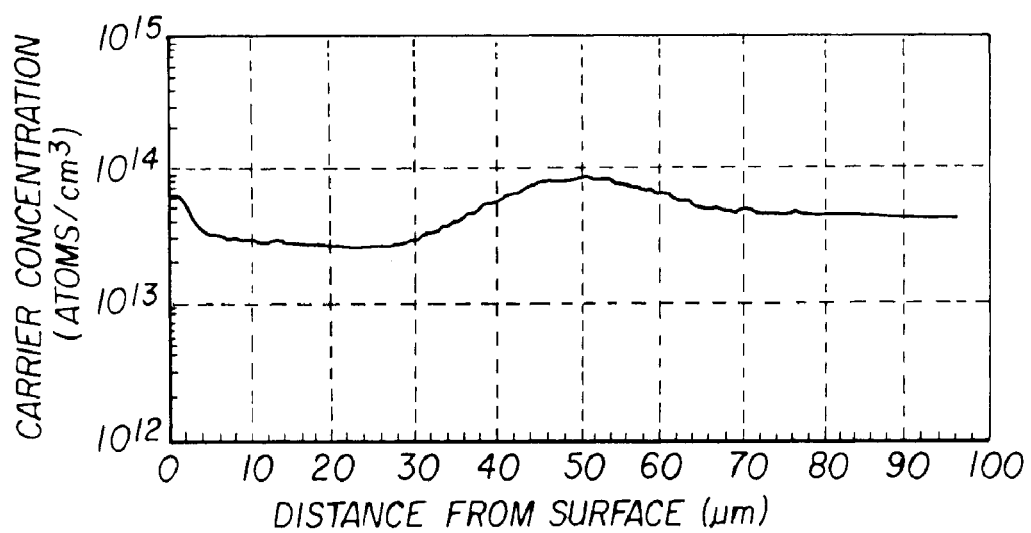
FIG. 39 shows the results of cross-sectional SR distribution measurements for the semiconductor device of Embodiment 7.
Figure 40:
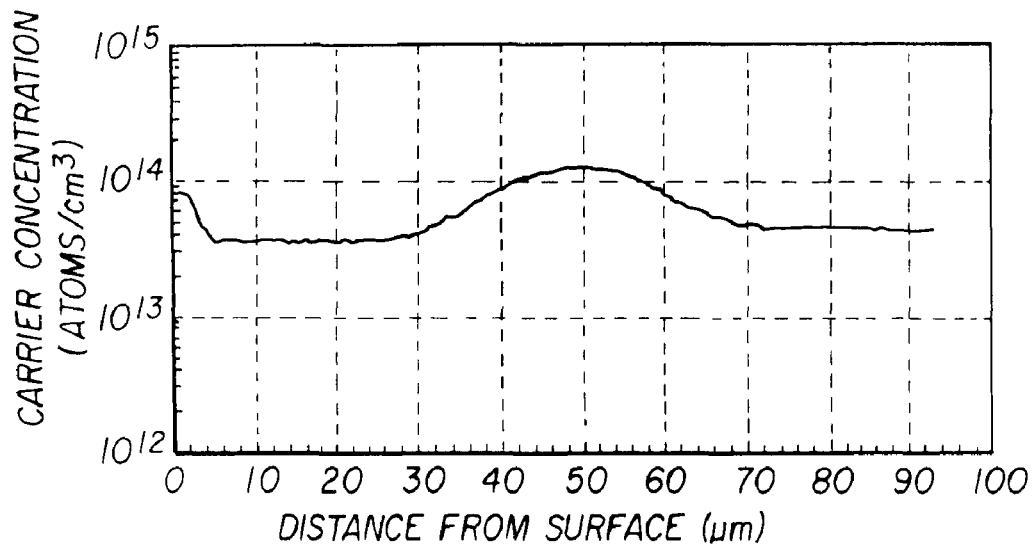
FIG. 40 shows the results of cross-sectional SR distribution measurements for the semiconductor device of Embodiment 7.
Figure 41:
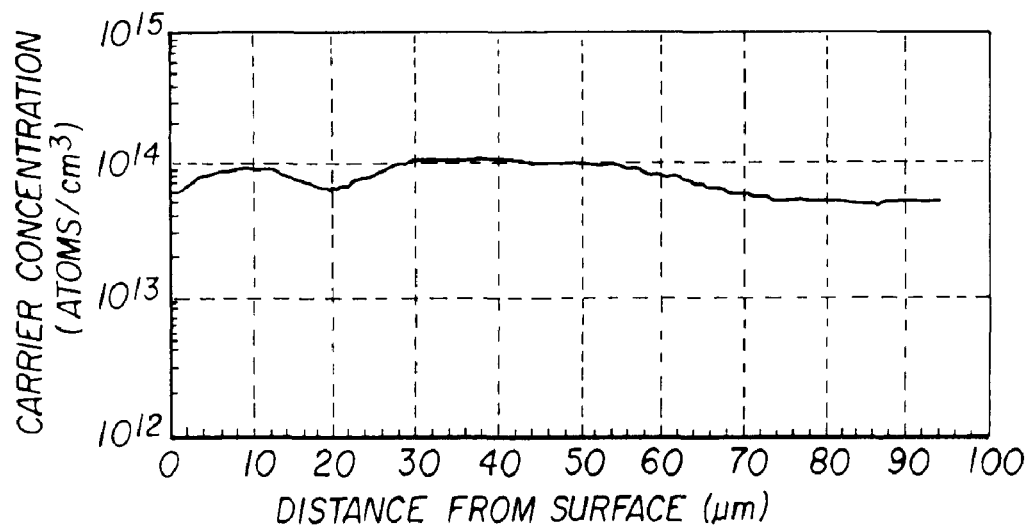
FIG. 41 shows the results of cross-sectional SR distribution measurements for the semiconductor device of Embodiment 7.

FIG. 36, FIG. 37 and FIG. 38 show the results of SR distribution measurements for samples with proton doses of $1.0\times10^{11}/cm^2$, for heat treatment temperatures of 300° C., 350° C., and 400° C. respectively. And, FIG. 39, FIG. 40 and FIG. 41 show the results of SR distribution measurements for samples with proton doses of $1.0\times10^{12}/cm^2$, for heat treatment temperatures of 300° C., 350° C., and 400° C. respectively.

FIG. 42 through FIG. 47 show the results of SR distribution measurements performed for devices for measurement fabricated using ordinary FZ wafers without phosphorus diffusion from the rear face, instead of DW wafers. The method of fabrication of the devices for measurement and difference with cases in which DW wafers were used were the same as described above.

Figure 42:
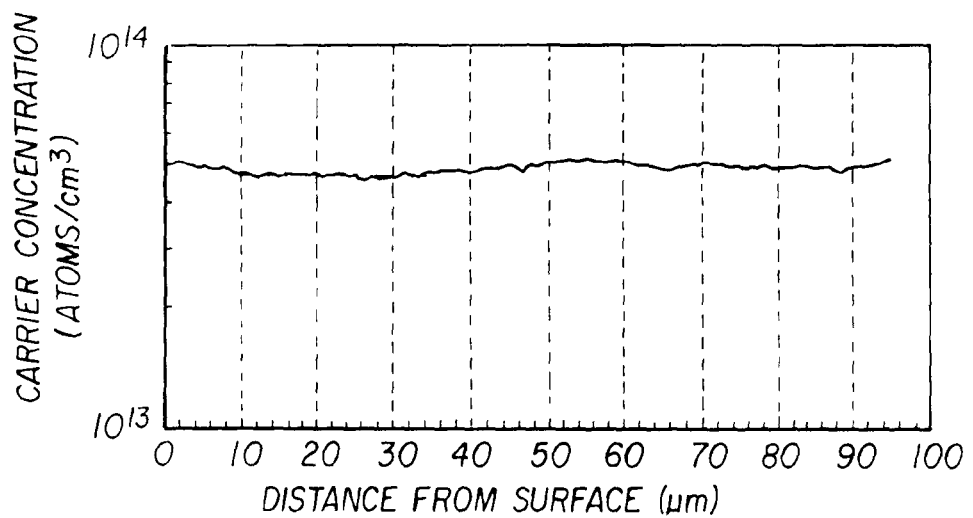
FIG. 42 shows the results of cross-sectional SR distribution measurements for a semiconductor device for comparison in Embodiment 7.
Figure 43:
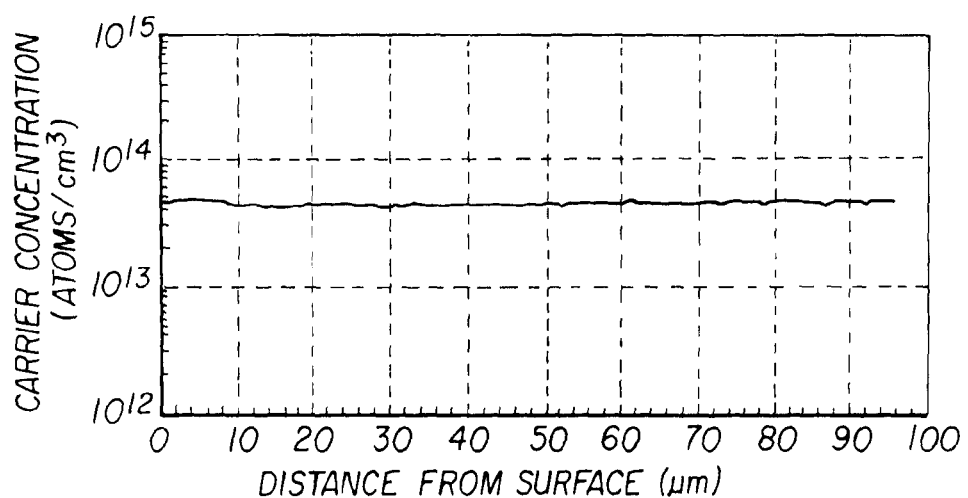
FIG. 43 shows the results of cross-sectional SR distribution measurements for a semiconductor device for comparison in Embodiment 7.
Figure 44:
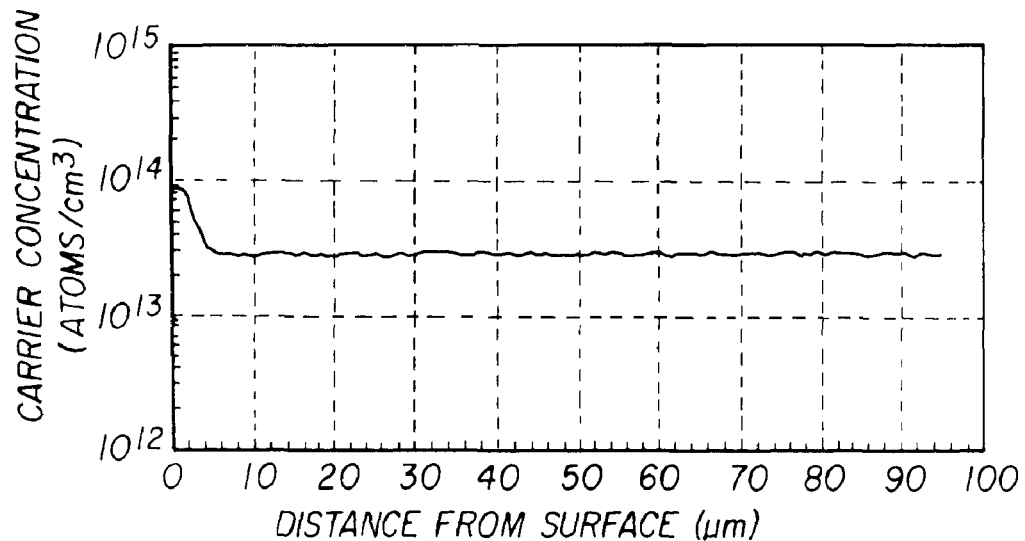
FIG. 44 shows the results of cross-sectional SR distribution measurements for a semiconductor device for comparison in Embodiment 7.
Figure 45:
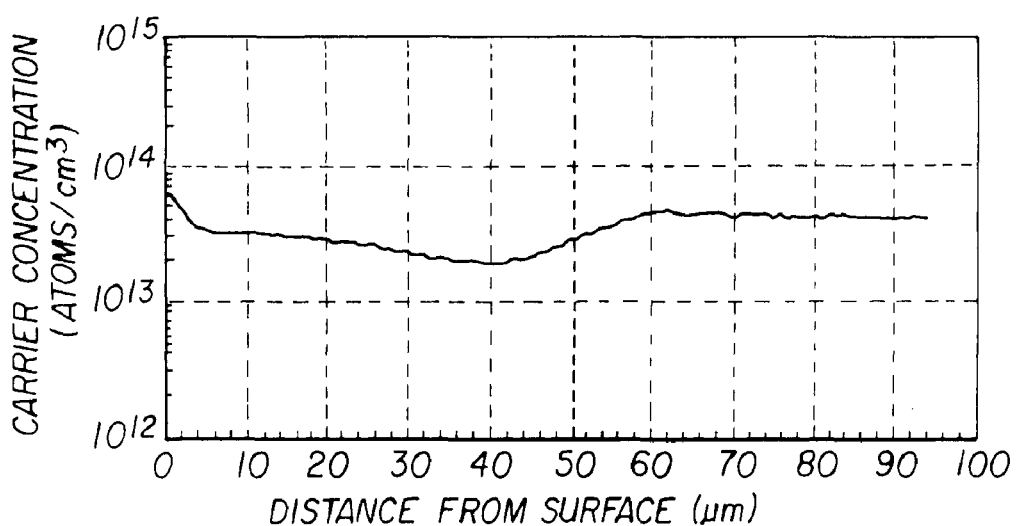
FIG. 45 shows the results of cross-sectional SR distribution measurements for a semiconductor device for comparison in Embodiment 7.
Figure 46:
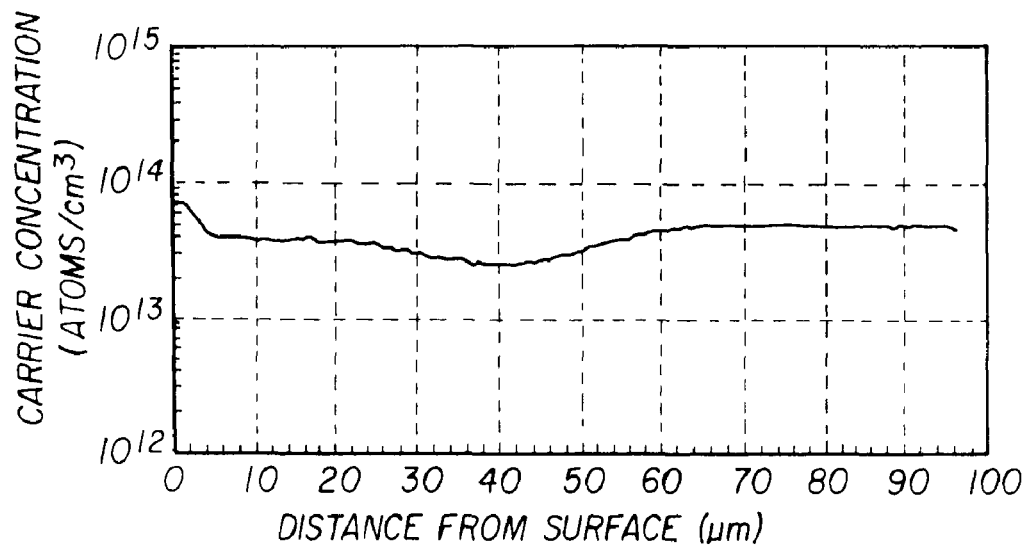
FIG. 46 shows the results of cross-sectional SR distribution measurements for a semiconductor device for comparison in Embodiment 7.
Figure 47:
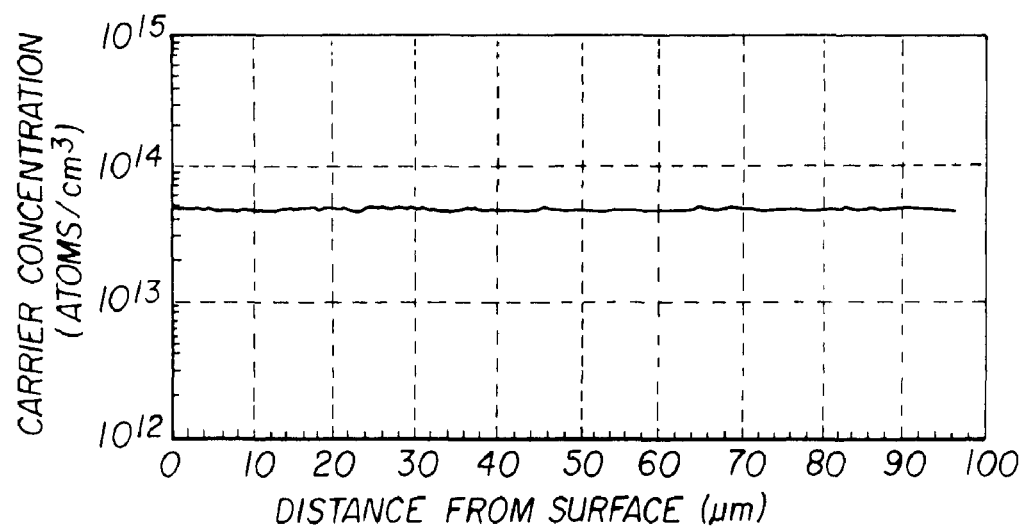
FIG. 47 shows the results of cross-sectional SR distribution measurements for a semiconductor device for comparison in Embodiment 7.

FIG. 42, FIG. 43 and FIG. 44 show the results of SR distribution measurements for samples with proton doses of $1.0\times10^{11}/cm^2$, for heat treatment temperatures of 300° C., 350° C., and 400° C. respectively. And, FIG. 45, FIG. 46 and FIG. 47 show the results of SR distribution measurements for samples with proton doses of $1.0\times10^{12}/cm^2$, for heat treatment temperatures of 300° C., 350° C., and 400° C. respectively.

In addition, helium ions ($He^{2+}$) may be used in place of protons ($H^+$). Samples are prepared using similar processes by helium ion irradiation at an accelerating voltage of 24 MeV, at a dose of $1\times10^{12}/cm^2$, with range Rp of 40 µm, and CV measurements and SR distribution measurements are performed.

FIG. 48 is a table summarizing the circumstances of formation of the broad buffer layer by proton or helium irradiation. In the table shown in FIG. 48, the ion type, irradiation amount, whether heat treatment is performed and the heat treatment temperature, are summarized for evaluations using both CV measurements and SR measurements.

In FIG. 48, "ⓧ" denotes satisfactory formation, that is, samples for which a concentration distribution in the desired shape (single-peak shape), with the maximum concentration peak in the ion range portion, is obtained, and for which the net concentration is higher than the bulk silicon concentration.

That is, these symbols indicate that a broad buffer layer is formed satisfactorily. "o" denotes samples for which CV measurement evaluations are partially at the equipment limits and so are inadequate, but for which the desired single-peak shape concentration distribution is obtained.

The symbol "Δ" denotes inadequate samples, that is, samples for which the desired single-peak shape concentration distribution is not obtained, or for which SR measurement values are smaller than CV measurement values. If the mobility declines, the SR measurement value is smaller than the CV measurement value. The symbol "x" indicates that the desired single-peak shape concentration distribution is not obtained.

When using a wafer containing oxygen (in the table, the cases of DW, CZ-FZ), the irradiation amount is $1\times10^{11}$ to $1\times10^{12}$ atoms/$cm^2$, and if the heat treatment temperature is 300° C. to 400° C., then it is seen that a broad buffer layer is formed satisfactorily. Hence it is desirable that processes be performed in this range of conditions.

Further, samples may be included which exceed the measurement limits, but for which the desired single-peak shape concentration distribution is obtained. In this case, the irradiation amount may be up to $1\times10^{14}$ atoms/$cm^2$, and the heat treatment temperature may be 450° C. or lower.

From FIG. 24 through FIG. 48, the following are concluded. First, as shown in FIG. 24 through FIG. 29, when a DW wafer is irradiated with protons, donor conversion occurs and high concentrations are obtained, relative to the substrate concentration ($1.4\times10^{13}$ atoms/cm3), primarily at a depth of 40 µm. As indicated by the "ⓧ" or "o" in FIG. 48, this can also be confirmed in the stage immediately after proton irradiation, that is, prior to heat treatment. This distribution is the broad buffer structure.

When the heat treatment temperature is 300° C. or higher and 400° C. or lower, a broad buffer structure is formed. Figures showing CV measurement results are omitted, but as indicated in FIG. 48, when the heat treatment temperature is 400° C. and a high dose ($1\times10^{13}/cm^2$ or $1\times10^{14}/cm^2$) is used, the concentration is also high in the region from the top surface to a depth of approximately 20 μm.

Figures showing CV measurement results are omitted, but when the heat treatment temperature is 450° C. or higher and the dose is low ($1\times10^{11}$/cm² or $1\times10^{12}$/cm²), recovery occurs nearly to the substrate concentration, and donors due to proton irradiation are annihilated. Figures showing CV measurement results are omitted, but even when heat treatment temperatures are 450° C. or higher, at high doses there exist some high-concentration regions resulting from donor conversion.

In this way, when irradiating a DW wafer with protons, a broad buffer structure is formed for all dose amounts, and in particular a temperature range of 300° C. or higher and 450° C. or lower is effective for such formation. Figures showing CV measurement results are omitted, but in the case of helium ion irradiation, when the heat treatment temperature is 450° C. or higher a concentration peak is seen in the vicinity of the range Rp, but donor concentrations are low compared with the case of protons.

As shown in FIG. 30 through FIG. 35, when irradiating an ordinary FZ wafer with protons, compared with results for DW wafers, the fractional increase in net doping concentration due to donor conversion is small, being at most approximately ⅓. From this it is seen that inclusion of oxygen in the wafer acts to effectively promote donor conversion. However, if the heat treatment temperature is higher than 400° C., there is no thermal donor influence from the top surface to a depth of 20 μm compared with cases in which DW wafers are used, so that normal FZ wafers may be used in the temperature range 400° C. to 450° C., and for example when heat treatment at temperatures of 420° C. and higher is necessary.

As shown in FIG. 36 through FIG. 41, when a DW wafer is irradiated with protons, a large difference in the concentration distributions in SR measurements and CV measurements is the fact that there are numerous conditions under which the donor concentration in the vicinity of the range Rp indicated by SR measurements is low. Although figures giving SR measurement results are omitted, when the proton dose is $1\times10^{11}$/cm² or $1\times10^{12}$/cm², the measured concentration without heat treatment (immediately after proton irradiation) is the same level as for the substrate.

SR measurement results for a heat treatment temperature of 450° C. are omitted, but high concentrations (donor conversion) occurs with a peak at the range Rp for all heat treatment temperatures from 300° C. to 450° C. However, although SR measurement results are omitted, as the dose is increased to $1\times10^{13}$/cm² and $1\times10^{14}$/cm², when the heat treatment temperature is 350° C. or lower, the concentration in the vicinity of the range Rp (up to a depth of approximately 20 μm) is greatly decreased. Moreover, the curve is not smooth, and kinks appear.

The reason for this is the decline in carrier mobility due to light ion irradiation. When performing ion irradiation, in the irradiated body (silicon), ions undergo repeated inelastic collisions until they stop, and during this time the silicon receives energy from the ions. As a result, in the ion transmission region partial fusion of the silicon occurs, and consequently defects occur. These defects are mainly dislocations (linear defects), and space charge occurs centered on the dislocation lines. This space charge scatters carriers, so that electron scattering relaxation times are shortened, and mobilities are lowered (see, for example, "Semiconductor Evaluation Techniques" (*Handoutai Hyouka Gijutsu*), Katouda, ed., Sangyou Tosho, 1989, page 42).

As shown in FIG. 42 through FIG. 47, when irradiating normal FZ wafers with protons, the concentration decrease in SR measurements is large compared with the case of DW wafers, and at maximum the concentration is decreased by an order of magnitude. That is, use of an ordinary FZ wafer results in lower mobility compared with use of a DW wafer.

Comparing FIG. 24 through FIG. 29 with FIG. 30 through FIG. 35, using ordinary FZ wafers the donor concentration is smaller by approximately ⅓ compared with DW wafers, so that the mobility is also reduced by ⅓. In this way, through the inclusion of oxygen in the wafer, the decline in mobility at the time of ion irradiation can be suppressed.

Figure 49:
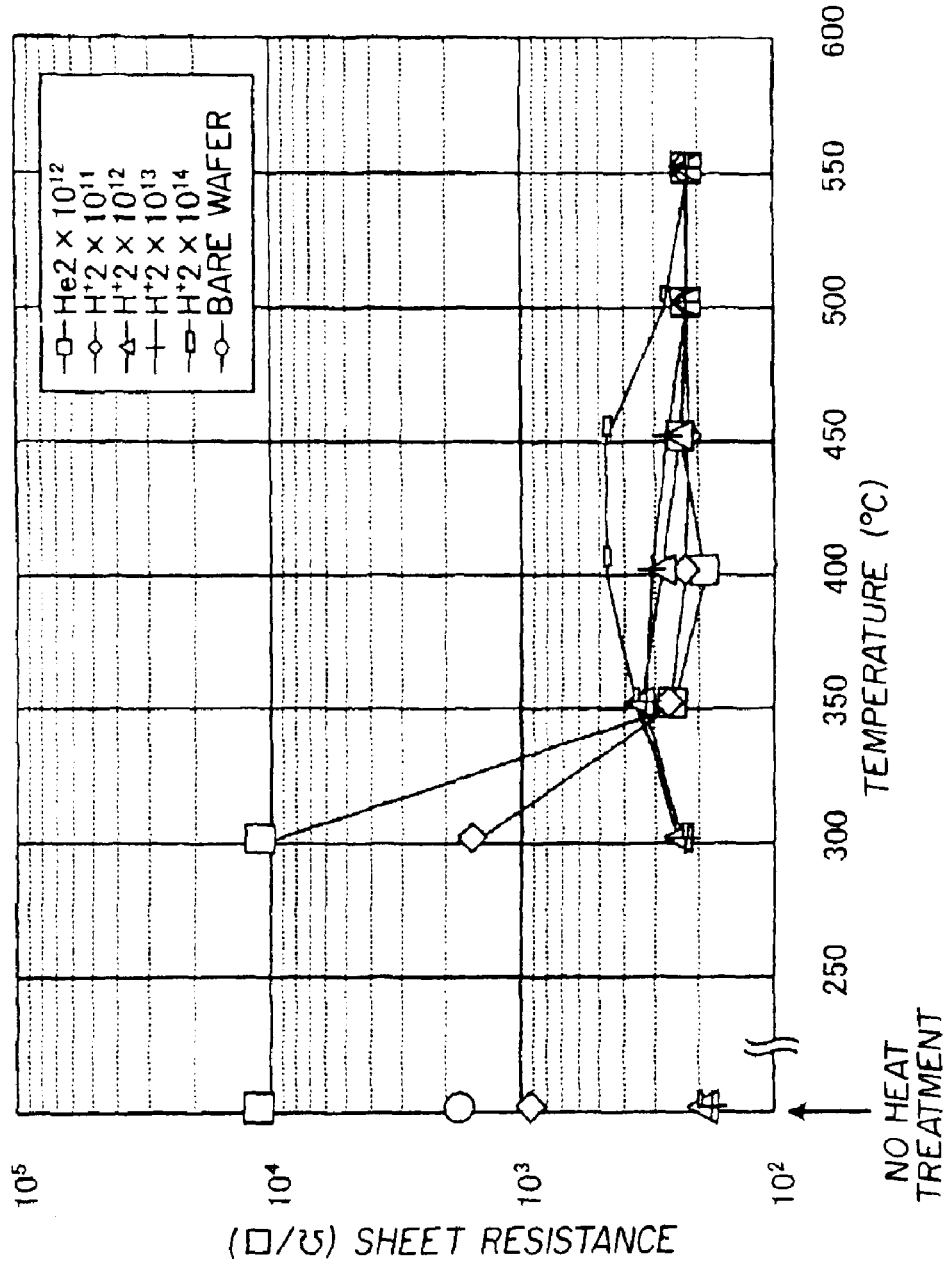
FIG. 49 shows the results of measurements of sheet resistance for semiconductor devices of Embodiment 7.

FIG. 49 shows the results of sheet resistance measurements at the wafer surface in a device for measurement using a DW wafer, with the range Rp of irradiated protons at 2 μm, but otherwise subjected to the same processing as above (heat treatment). The sheet resistance most closely reflects the resistance in the uppermost layer, and the resistivity from the surface to a depth of approximately 2 μm can be ascertained. Between the sheet resistance Rs and diffusion depth xj and the average resistivity ρs for the diffusion region, the relation of equation (2) below obtains.

$$\rho_s = R_s \cdot x_j \quad \text{Formula 2}$$

As shown in FIG. 49, in a DW wafer, when the heat treatment temperature is 350° C. or higher, the sheet resistance saturates at approximately 200Ω/. This indicates that the lower limit to the depth of the CV measurement carrier concentration distribution (from the uppermost layer to approximately 5 μm) is an average concentration of approximately $1\times10^{15}$/cm³.

This fact indicates that not only thermal donors, but complex donors of hydrogen, oxygen and silicon remain stably in the uppermost layer. From this it is inferred that using a DW wafer containing oxygen, irradiating with protons at a dose described above, and heat treating in the above-described temperature range, is effective for forming a stable broad buffer layer. Satisfactory results for the sheet resistance were also obtained for proton doses of $1\times10^{13}$/cm² and for $1\times10^{14}$/cm².

Embodiment 8

In general, as disclosed in Patent Documents 5, 7 and 8, ion irradiation has the effect of lowering the lifetime of minority carriers in the wafer. The results of investigations of the relation between this reduction in lifetime and donor conversion are explained.

Figure 50:
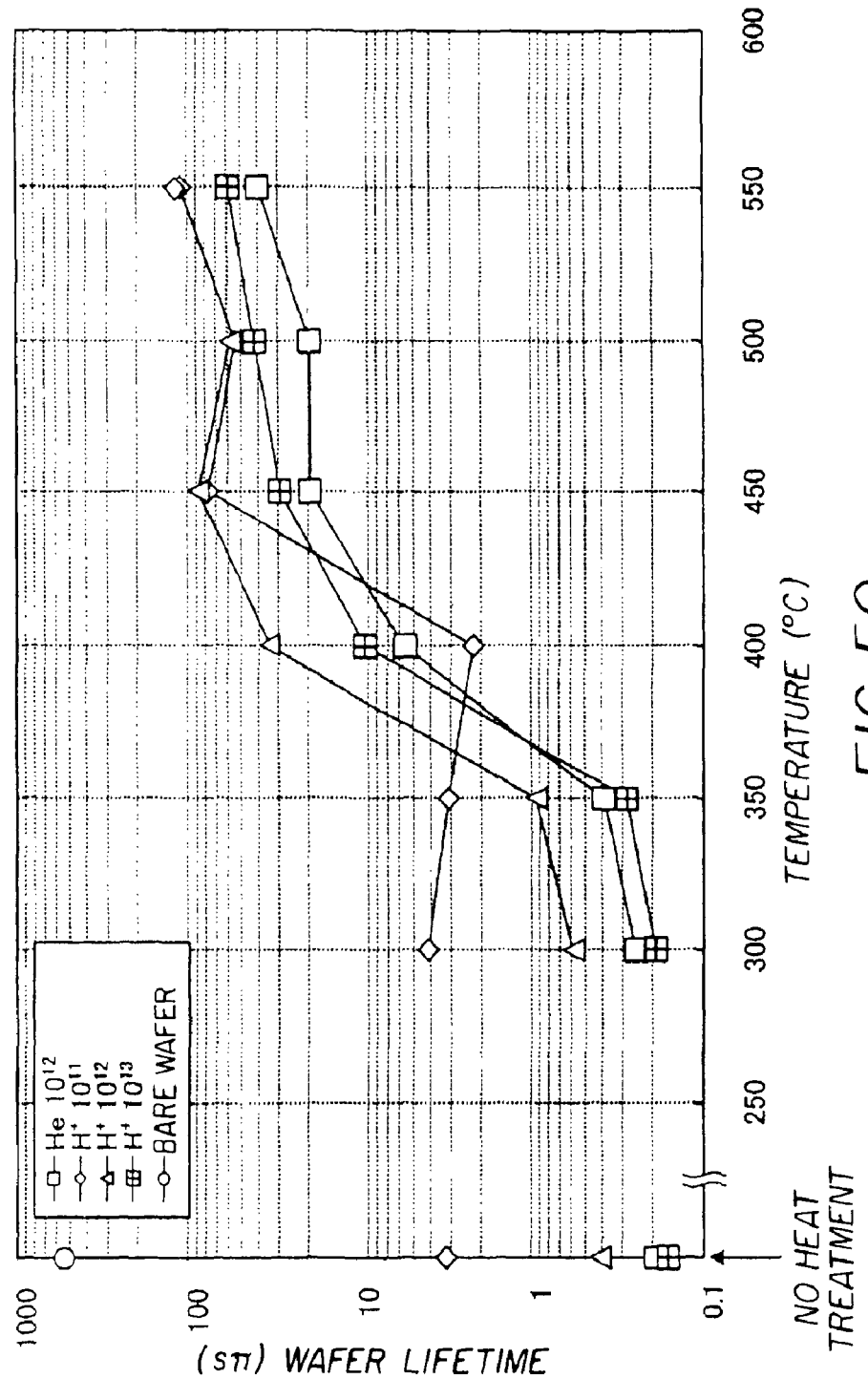
FIG. 50 shows the relation between wafer heat treatment temperature and lifetime in Embodiment 8.

FIG. 50 shows the relation between wafer heat treatment temperature and lifetime in Embodiment 8. Here, lifetime measurements are performed for wafers subject to proton irradiation at a dose of $1\times10^{11}$ to $1\times10^{13}$/cm², and heat treated at various temperatures, for wafers subjected to helium ion irradiation and heat treatment at various temperatures, and for bare wafers on which only a 1000 Å oxide film was formed.

In lifetime measurements, a Kobelco Research Institute LTA-1200EP is used. FIG. 50 shows average values of multipoint measurements at 49 points in the wafer. From FIG. 50 it is seen that in proton irradiation at a dose of $1\times10^{12}$/cm² and higher, the lifetime changes markedly between 350° C. and 400° C.

The lifetime for bare wafers without proton irradiation or heat treatment is approximately 400 μs. On the other hand, although not recovered to this value (approximately 400 μs), if heat treatment at 400° C. or higher is performed, the lifetime of a proton-irradiated wafer is approximately 10 μs, which is desirable from the standpoint of control of device characteristics (diode forward voltage, reverse recovery losses, and similar).

However, as explained above, as conditions for formation of a broad buffer profile through donor conversion, it is desirable that the heat treatment temperature be 300° C. to 450° C. Hence from these results, a proton dose of $1\times10^{11}$/cm² or above and $1\times10^{14}$/cm² or below, and a heat treatment temperature of 300° C. or above and 450° C. or below, and preferably 350° C. or above and 420° C. or below, are satisfactory.

This invention is not limited to the above-described embodiments, and various modifications are possible. For example, the dimensions, concentrations, voltage values and current values, temperatures and times, and other treatment conditions and similar described in the embodiments, and various other values are examples, and this invention is not limited to these values. In the embodiments, the first conduction type was taken to be the N type and the second conduction type to be the P type, but this invention is similarly applicable if the first conduction type is the P type and the second conduction type is the N type.

Further, in the above embodiments, the lifetime in proton-irradiated regions is recovered to the original wafer lifetime (15 to 30 μs), but the proton irradiation amount and other conditions, as well as the recovery heat treatment conditions (temperature, time, atmosphere, and similar) may be modified, and the lifetime value in proton-irradiated regions may be reduced. Further, this invention is not limited to 1200 V class devices, but can be similarly applied to 600 V, 1700 V, or higher class devices.

For example, in the case of a 600 V class device, the wafer resistivity is 20 to 90 Ω-cm, and the final thickness is 50 to 70 μm. In the case of a 1700 V class device, the wafer resistivity is 80 to 200 Ω-cm, and the final thickness is 120 to 200 μm.

INDUSTRIAL APPLICABILITY

As explained above, a semiconductor device and manufacturing method for a semiconductor device of this invention are effective for use in power semiconductor equipment, and in particular are suitable for IGBT modules and IPMs (Intelligent Power Modules) with low electrical losses, low electromagnetic radiation noise, and which take environmental issues into consideration.

What is claimed is:

1. A manufacturing method for the semiconductor device comprising:

introducing oxygen into a semiconductor substrate of a first conduction type which serves as a first semiconductor layer of a semiconductor device;

irradiating a first main face or second main face of the semiconductor substrate with protons with a proton dose of $1\times10^{11}$ atoms/cm$^2$ or higher and $1\times10^{14}$ atoms/cm$^2$ or lower and introducing crystal defects into the first semiconductor layer; and performing heat treatment to recover crystal defects introduced into the first semiconductor layer, thereby causing a net doping concentration of a portion within the first semiconductor layer to be higher than the initial net doping concentration of the semiconductor substrate.

2. The manufacturing method for a semiconductor device according to claim 1, further comprising:

after introducing oxygen into the semiconductor substrate, prior to charged particle irradiation, forming a second semiconductor layer of a second conduction type having higher concentration than the semiconductor substrate on a side of the first main face of the semiconductor substrate;

grinding the second main face of the semiconductor substrate after recovery of crystal defects by the heat treatment; and forming a third semiconductor layer of the first conduction type having higher concentration than the first semiconductor layer on the ground second main face.

3. The manufacturing method for a semiconductor device according to claim 1, further comprising:

introducing first conduction type impurities together with oxygen at the time of introduction of oxygen into the semiconductor substrate, and forming a third semiconductor layer of the first conduction type with higher concentration than the semiconductor substrate over a second surface of the semiconductor substrate; and after the introduction of oxygen and the first conduction type impurities into the semiconductor substrate, and before charged particle irradiation, forming a second semiconductor layer of the second conduction type, with higher concentration than the first semiconductor layer, on a first surface of the first semiconductor layer into which the first conduction type impurities have not been introduced.

4. The manufacturing method for a semiconductor device according to any one of claim 1, 2 or 3, characterized in that, after introduction of crystal defects by charged particle irradiation, the heat treatment is performed at a temperature of 250° C. or higher and 500° C. or lower.

5. The manufacturing method for a semiconductor device according to any one of claim 1, 2 or 3, characterized in that, after introduction of crystal defects by charged particle irradiation, the heat treatment is performed at a temperature of 300° C. or higher and 450° C. or lower.

6. The manufacturing method for a semiconductor device according to any one claim 1, 2 or 3, characterized in that, after introduction of crystal defects by charged particle irradiation, the heat treatment is performed at a temperature of 350° C. or higher and 420° C. or lower.

7. The manufacturing method for a semiconductor device according to any one of claim 1, 2 or 3, wherein the concentration of the oxygen atoms is $1.0\times10^{16}$ (atoms/cm$^3$) or higher.

8. The manufacturing method for a semiconductor device according to claim 1, wherein the concentration of the oxygen atoms is $1.0\times10^{16}$ (atoms/cm$^3$) and $1\times10^{18}$ atoms/cm$^3$ or lower.

9. A semiconductor device comprising:

a first semiconductor layer of a first conduction type;

a second semiconductor layer of a second conduction type having a higher concentration than the first semiconductor layer, which is formed on a side of a first main face of the first semiconductor layer; and a third semiconductor layer of the first conduction type having a higher concentration than the first semiconductor layer, which is formed on a side of a second main face of the first semiconductor layer;

wherein there exists at least one location in the first semiconductor layer at which an impurity concentration in the first semiconductor layer is a maximum, and the impurity concentration in the first semiconductor layer decreases from the location of the maximum impurity concentration toward both the second semiconductor layer and the third semiconductor layer, and wherein at least the location of the maximum impurity concentration in the first semiconductor layer comprises oxygen atoms and hydrogen atoms, and wherein the concentration of the oxygen atoms is $1.0\times10^{16}$ (atoms/cm$^3$) or higher.

10. A semiconductor device according to claim 9, wherein the concentration of oxygen is $1\times10^{16}$ atoms/cm$^3$ or higher and $1\times10^{18}$ atoms/cm$^3$ or lower.

* * * * *